(12) United States Patent
Chen et al.

(10) Patent No.: US 8,006,216 B1
(45) Date of Patent: Aug. 23, 2011

(54) DYNAMIC PUSH FOR TOPOLOGICAL ROUTING OF SEMICONDUCTOR PACKAGES

(75) Inventors: Guoqiang Chen, Union City, CA (US);
Kaushik Sheth, Los Altos, CA (US);
Egino Sarto, Palo Alto, CA (US);
Shenghua Liu, Beijing (CN)

(73) Assignee: Magma Design Automation, Inc., San Jose, CA (US)

( * ) Notice: Subject to any disclaimer, the term of this patent is extended or adjusted under 35 U.S.C. 154(b) by 603 days.

(21) Appl. No.: 12/134,849

(22) Filed: Jun. 6, 2008

(51) Int. Cl.
*G06F 17/50* (2006.01)
(52) U.S. Cl. .......................... 716/126; 716/129; 716/130
(58) Field of Classification Search .................. 716/126, 716/129, 130
See application file for complete search history.

(56) References Cited

U.S. PATENT DOCUMENTS

| | | | | |
|---|---|---|---|---|
| 6,226,560 B1 * | 5/2001 | Hama et al. | ...................... | 700/97 |
| 6,516,447 B2 * | 2/2003 | Wadland et al. | .............. | 716/129 |
| 6,596,549 B2 * | 7/2003 | Kitamura et al. | .................. | 438/6 |
| 6,829,757 B1 * | 12/2004 | Teig et al. | ...................... | 716/112 |
| 6,877,146 B1 * | 4/2005 | Teig et al. | ...................... | 716/129 |
| 6,898,772 B1 * | 5/2005 | Teig et al. | ...................... | 716/122 |
| 6,928,633 B1 * | 8/2005 | Teig et al. | ...................... | 716/130 |
| 7,017,137 B2 * | 3/2006 | Wadland et al. | .............. | 716/112 |
| 7,161,812 B1 * | 1/2007 | Thomas | ........................ | 361/777 |
| 7,336,499 B2 * | 2/2008 | Hagiwara | ..................... | 361/749 |
| 7,454,736 B2 * | 11/2008 | Kitamura | ..................... | 716/132 |
| 7,594,215 B2 * | 9/2009 | Wadland et al. | .............. | 716/129 |
| 2006/0225018 A1 * | 10/2006 | Kitamura | ........................ | 716/13 |

OTHER PUBLICATIONS

Chen, Shuenn-shi, et al. "An Automatic Router for the Pin Grid Array Package," ASP-DAC'99, vol. 146, pp. 275-281, Nov. 1999.
Fang, Jia-Wei, et al. "A Routing Algorithm for Flip-Chip Design," 2005-ICCAD, pp. 753-758, 2005.
Kubo, Yukiko, et al. "A Global routing Method for 2-Layer Ball Grid Array Packages," ISPD'0, pp. 36-43, 2005.
Sarrafzaheh, Kuo-Feng Liao, et al. "Single-Layer Global Routing," IEEE Trans on CAD, vol. 13, No. 1, Jan. 1994.
Shi, Rui, et al. "Efficient Escape Routing for Hexagonal Array of High Density I/OS," Proceedings of the 43rd annual conference on Design automation, pp. 1003-1008, 2006.
Tsai, Chia-chun, et al. "NEWS: A Net-Even-Wiring System for the Routing on a Multilayer PGA Package," IEEE Trans. on CAD, vol. 17, No. 2, pp. 182-189, 1998.
Wei-Ming-Dai, Wayne, et al., "Topological Routing in SURF: Generating a Rubber-Band Sketch," Proceedings of the 28th conference on ACM/IEEE design automation, pp. 39-44, 1991.
Yu, Man-Fai, et al. "Interchangeable Pin Routing with Application to Package Layout," ICCAD'96, pp. 668, 1996.

* cited by examiner

*Primary Examiner* — Sun J Lin
(74) *Attorney, Agent, or Firm* — Kilpatrick Townsend & Stockton LLP

(57) ABSTRACT

Techniques are disclosed for performing topologically planar routing of System in Packages (SiPs). A routing graph can be represented by a particle-insertion-based constraint Delaunay triangulation (PCDT) and its dual. A dynamic search routing may be performed using a DS* routing algorithm to determine the shortest path on the dual graph between a start point and an end point. Based on a dynamic pushing technique, net ordering problems may be solved. A first wire can be topologically routed. Dynamic search routing of a second wire may be performed. The first wire may be pushed or detoured in response to the dynamic searching routing of a second wire.

32 Claims, 21 Drawing Sheets

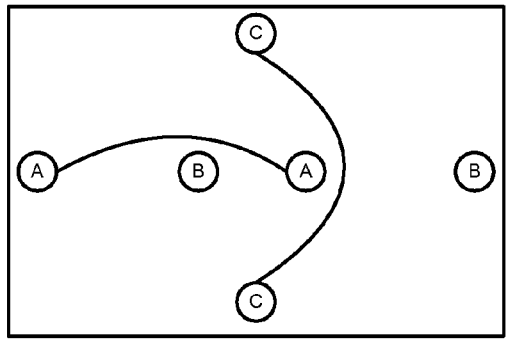 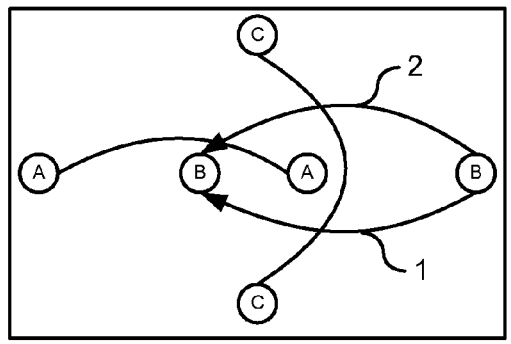
FIG. 14A  FIG. 14B
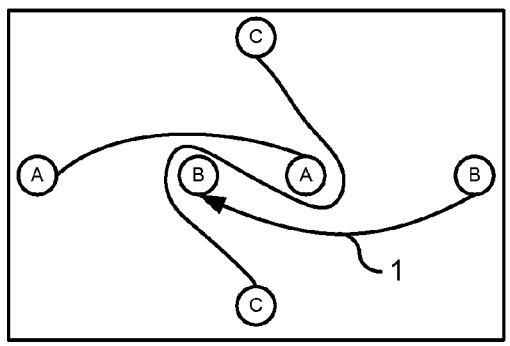 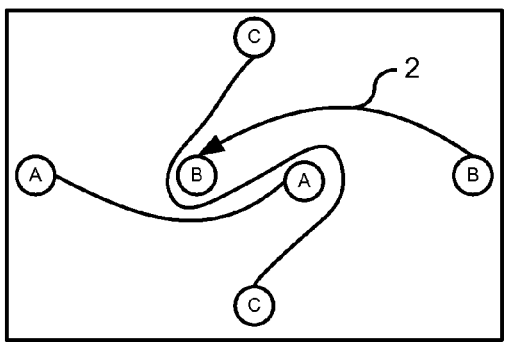
FIG. 14C  FIG. 14D

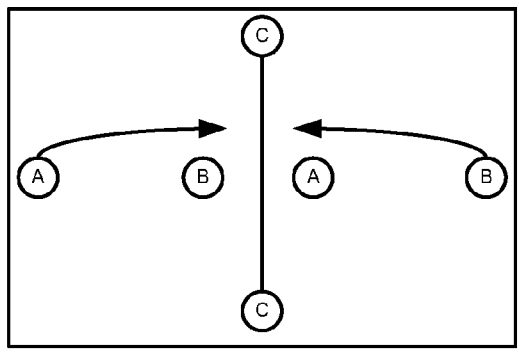
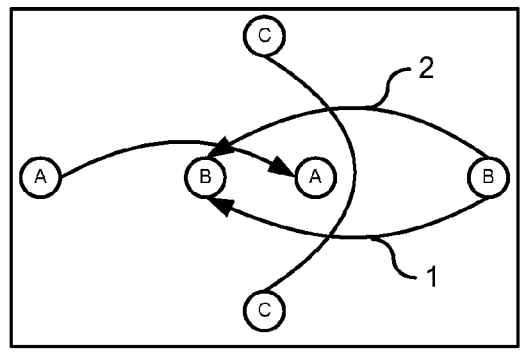
FIG. 15A                FIG. 15B
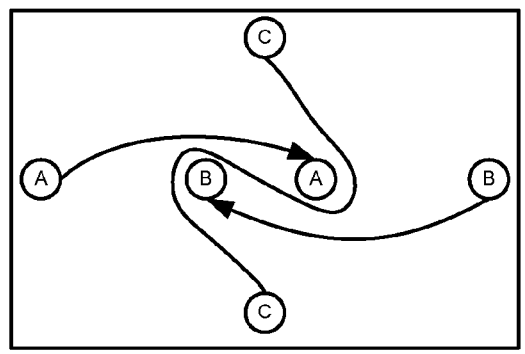
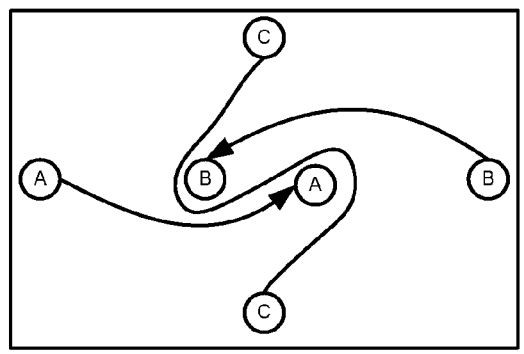
FIG. 15C                FIG. 15D

DYNAMIC PUSH FOR TOPOLOGICAL ROUTING OF SEMICONDUCTOR PACKAGES

CROSS-REFERENCES TO RELATED APPLICATIONS

The present disclosure may be related to the following commonly assigned applications/patents:

U.S. patent application Ser. No. 12/146,215, filed Jun. 25, 2008 and entitled "Floating Endpoint Technique for Topological Routing of Semiconductor Packages."

The respective disclosures of these applications/patents are incorporated herein by reference in their entirety for all purposes.

BACKGROUND OF THE INVENTION

This disclosure related to electronic design automation (EDA), more particularly to techniques for topological routing of semiconductor packages.

A System-in-a-Package or System in Package (SiP) can include a number of integrated circuits or chips enclosed in a single package or module. SiP with more than one microchip in a package can improve performance and reduce costs. SiP may perform all or most of the functions of an electronic system, such as used inside a mobile phone, PC, digital music player, etc. Compared with system-on-a-chip (SOC), SiP may provide higher integration, greater flexibility, and faster time to market and is becoming a mainstream technology.

SIP usually uses ball grid array (BGA) substrate and wire bonding or flip-chip to connect a microchip to a substrate. Compared with earlier dual-in-line packages (DIPs) and pin grid array (PGA) packages, BGA can have higher integrity, higher reliability, lower coupling, reduced cost, and lower thermal-resistance solder balls. With SiP, silicon dies containing chips may be stacked vertically on the BGA substrate, and may be internally connected by fine wires that are buried in the package. Alternatively, with a flip chip technology, solder bumps can be used to join stacked chips together.

For wire bonding dies, I/O pads of a microchip may be connected to bond pads around the chip cavity through bonding wires. For flip-chip dies, on-chip re-distribution layer (RDL) routing may first connect I/O pads to bump pads. Escape routing may then break out bump pads to the boundary of the die (i.e., the escape break points) in build-up or signal layers associated with the package. Off-chip substrate routing may connect escape break points of flip-chip dies or bond pads of wire bonding dies to balls (usually in the bottom layer) of a BGA package substrate. However, high-density SiP integration makes off-chip routing a challenging task. Some design challenges include high-density, planar, and non-Manhattan requirements. Additionally, existing substrate routing may allow limited locations for start-points.

Off-chip substrate routing usually includes two steps: topological routing and detailed routing. In general, the escape break point for a flip-chip or the bond pad for a wire bonding die can be called a start-point, and the location above the center of the corresponding ball (but in the same layer as the start-point) can be called its end-point. After topological routing, staggered vias may be used to connect an end-point to a ball of a BGA package.

Many attempts at topological routing can be called 1.5 D (one and a half dimensional) routing. In general, the build-up layer may be divided into four zones. In every zone, all bond-pads can be located in one line. Often, bond-pads may be assumed to be located along a single rectangular ring. Pins may then be located side to side with respect to the bond-pads. However, SiP can require flexible locations of bond-pads and escape break points beyond the single rectangular ring. Therefore, conventional 1.5 D routing may not be flexible enough for SiP and even some one-die packages. Moreover, once a net is routed, it can become an obstacle for other un-routed nets and may impact the results of routing, resulting in the net ordering problem.

Accordingly, what is desired is to solve problems relating to topological routing of semiconductor packages, some of which may be discussed herein. Additionally, what is desired is to reduce drawbacks related to topological routing of semiconductor packages, some of which may be discussed herein.

BRIEF SUMMARY OF THE INVENTION

Techniques are disclosed for performing topologically planar routing of System in Packages (SiPs). A routing graph can be represented by a particle-insertion-based constraint Delaunay triangulation (PCDT) and its dual. A dynamic search routing may be performed using a DS* routing algorithm to determine the shortest path on the dual graph between a start point and an end point. Based on a dynamic pushing technique, net ordering problems may be solved.

In various embodiments, a method for wire routing of a package include receiving topological routing of a first wire. Dynamic search routing may be performed for a second wire. The first wire may be pushed or detoured in response to the dynamic search routing for the second wire. A particle-insertion-based constraint Delaunay triangulation may be generated for the build-up layer of the package. The dual of the particle-insertion-based constraint Delaunay triangulation may also be generated. A path on the dual of the particle-insertion-based constraint Delaunay triangulation may be determined between a start-point and an end-point associated with the second wire.

The path may include the shortest path on the dual of the particle-insertion-based constraint Delaunay triangulation between the start-point and the end-point associated with the second wire. In some embodiments, an intersection may be determined between the first wire and the path. The first wire may be pushed along with the second wire to another location on the dual of the particle-insertion-based constraint Delaunay triangulation that avoids the intersection.

In further embodiments, a set of control parameters can be received for controlling the topologically planar routing with dynamic push. A decision may be made whether to push the first wire based on the set of control parameters. Additionally, modifications or updates may be made to the set of control parameters in response to pushing the first wire and adding other nets. Dynamic search routing of the first and second wire may then be performed based on the modified set of control parameters. In one embodiment, the second wire may be pushed or detoured in response to the dynamic search routing of the first wire.

In one example of a control parameter, a cost associated with pushing of the first wire in response to the dynamic search routing for the second wire may be determined. The cost may indicate the expense of pushing the wire, and whether a more optimal solution may be found. The first wire may be detoured when the cost is inexpensive or fails to exceed a pre-determined threshold. In some embodiments, congestion associated with the first wire may be determined. The first wire may be detoured when the congestion associated with the first wire is low or otherwise satisfies a pre-determined tolerance. In still further embodiments, the first wire may be modified subsequent to being pushed in response to the dynamic search routing for the second wire to reduce the length of the first wire.

In various embodiments, a method for routing topological interconnections for a package may include receiving information associated with a chip. Initial escape routing of a bump array may be determined for the chip. The initial escape routing can be indicative of a set of I/Os along a set of escape boundaries. A set of obstructions may also be determined on a set of package layers. Additionally, scale of via staggering pitches may be determined on the set of package layers.

For each build-up layer in the set of package layers, going from a top layer to a bottom layer, each I/O in the set of I/Os may be topologically planar routed to a location substantially vertical to the center of a corresponding ball. In some embodiments, at least a first net is dynamically pushed in response to the topologically planar routing of a second net. Stopping points associated with I/Os for failed nets may be transferred to another build-up layer by stack vias. On the bottom layer, vias may be assigned for one or more successfully routed nets.

In some embodiments, congestion associated with each build-up layer can be analyzed to generate a congestion map. The topological connections, congestion map, and fail-routed nets may out output for further analysis or processing.

Topologically planar routing each I/O in the set of I/Os may include distributing a set of particles over the build-up layer to generating a constraint Delaunay triangulation (CDT) graph and generating the dual of the CDT graph. Dynamic search routing may be performed for each I/O based on the DCDT graph. In some embodiments, a set of nets may be sorted on the build-up layer. Each net may be sequentially routed in order in response to one or more control parameters. One or more re-route iterations may also be performed to determine an improvement in the routing wire length. Once routing iterations are complete, cross points may be distributed on a graph edge for each routed net.

The shortest path from a source point to a sink point for a net using a dynamic search technique based on a triangulation plane. One or more nets blocking a search path associated with the net may be pushed during a dynamic search. The pushed nets may be carried along with the net to a current searching node. In some embodiments, a realized cost and an estimated cost may be determined such that the estimated cost is compared to a predefined stopping cost and the number of pushed nets is compared to a maximal allowed pushing net count. If the current searching node is within a threshold to the sink point for the net, post-processing the pushed nets to eliminate a "U" detour happening on a triangle edge and/or a "V" detour happening in a triangle.

In further embodiments, length of the shortest path from the source point to the dual node of a current searching triangle and wire widths of the net and the pushed nets may be determined to calculate costs. In another embodiment, wire widths of the net and the pushed nets and geometry distance from the dual node of a current searching triangle to the sink point may be determined to calculate costs.

In still further embodiments, when performing re-route iterations, each net in may be re-ordered response to the last routing iteration. Control parameters may be modified or updated in response to the last routing iteration such that each net may be re-routed based on the re-ordering and the modified control parameters. Estimates may be made for the realized wire length for each net to determine re-ordering. Each net may be sorted in decreasing order of the estimated realized wire length. Additionally, the order may be modified in response to a pushing order of pushed nets. In some embodiments, a net path may be deleted on the current build-up layer. The net may be routed immediately based on the modified control parameters.

In various embodiments, routing topological interconnections for a package may include receiving information associated with a build-up layer of the package. A constraint Delaunay graph may be generated and a corresponding dual constraint Delaunay graph may be generated for the build-up layer. A routing order associated with a set of nets may be determined for the build-up layer to generate a first set of ordered nets. A set of routing control parameters may also be determined or received. Dynamic search routing may be performed using the dual constraint Delaunay graph and the set of control parameters to determine topological planar routing for each net in the first set of ordered nets, wherein at least one net in the first set of ordered nets detours another net in the first set of nets.

A further understanding of the nature, advantages, and improvements offered by those inventions disclosed herein may be realized by reference to remaining portions of this disclosure and any accompanying drawings.

BRIEF DESCRIPTION OF THE DRAWINGS

In order to better describe and illustrate embodiments and/or examples of those inventions disclosed herein, reference may be made to one or more accompanying drawings. The additional details or examples used to describe the accompanying drawings should not be considered as limitations to the scope of any of the disclosed inventions, the presently described embodiments and/or examples, and the presently understood best mode of these inventions.

FIGS. 14A, 14B, 14C, and 14D are illustrations depicting topological routing using dynamic push or detour for a second net ordering in one embodiment according to the present invention;

FIGS. 15A, 15B, 15C, and 15D are illustrations depicting topological routing using dynamic push or detour for a third net ordering in one embodiment according to the present invention;

DETAILED DESCRIPTION OF THE INVENTION

Figure 1:
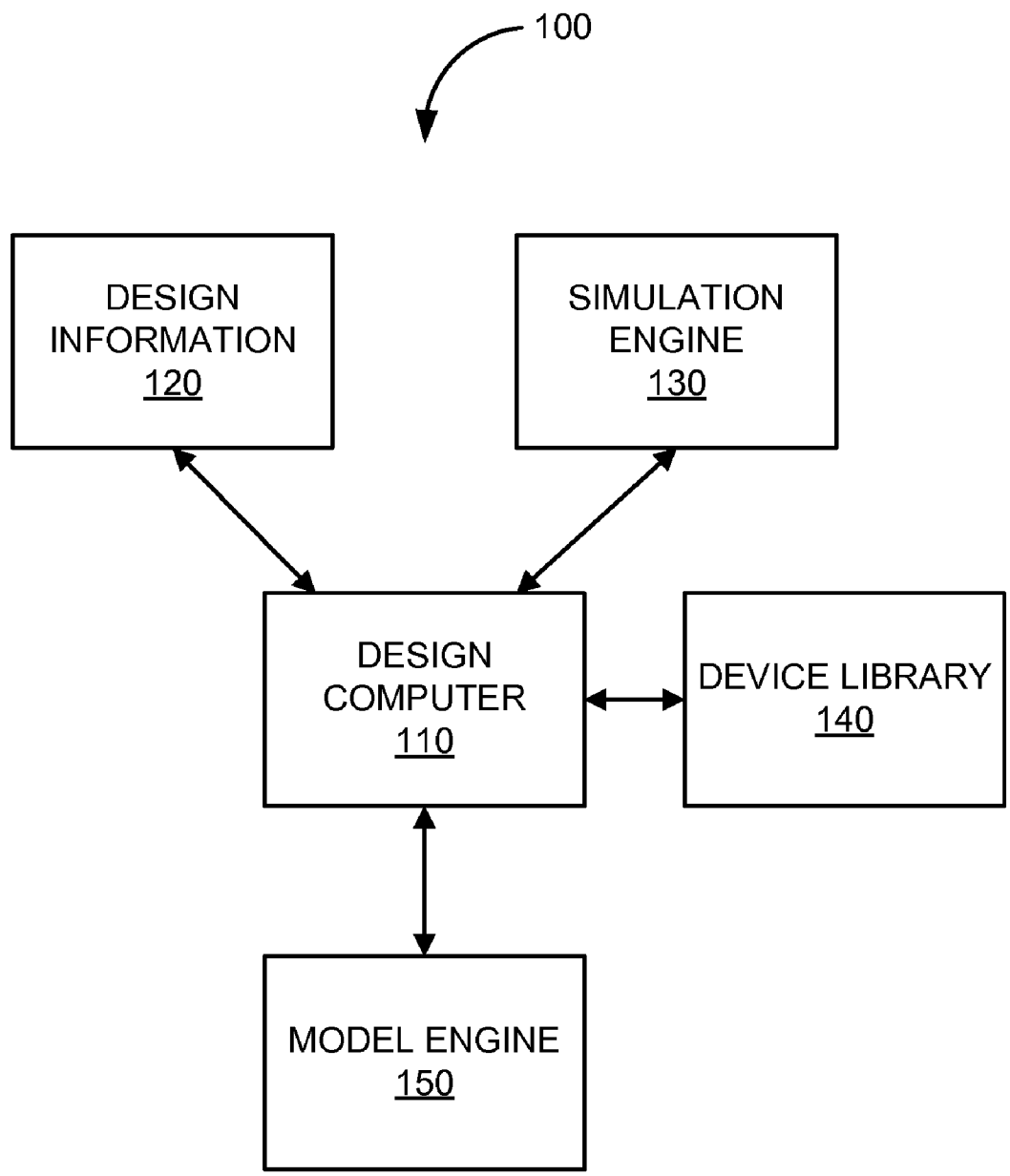
FIG. 1 is a simplified block diagram of an electronic design automation (EDA) system that may be used for topological routing of semiconductor packages in one embodiment of the present invention.

FIG. 1 is a simplified block diagram of electronic design automation (EDA) system 100 that may be used for topological routing of semiconductor packages in one embodiment of the present invention. System 100 can include design computer 110 coupled to design information 120, simulation engine 130, device library 140, and model engine 150.

In various embodiments, a user may interact with or otherwise use design computer 110 to design and produce electronic systems ranging from printed circuit boards (PCBs) to integrated circuits. The user may use design computer 110 (along with design information 120, simulation engine 130, device library 140, and model engine 150) of system 100 to perform co-design and architecture of packages and integrated circuits.

In some embodiments, the user may interact with or otherwise use design computer 110 to perform design tasks, such as floorplanning, placement, routing, or other steps for creating an integrated circuit. In one embodiment, a design may be created showing the expected locations for gates, power and ground planes, I/O pads, soft/hard macros, blocks, or the like. System 100 may perform logic synthesis, such as the translation of a chip's abstract, logical RTL-description into a discrete netlist of logic-gate (Boolean-logic) primitives.

System 100 may simulate a circuit's operation so as to verify correctness and performance. In another example, system 100 provides low-level transistor-simulation of a schematic/layout's behavior. In yet another example, system 100 may provide a digital-simulation of an RTL or gate-netlist's digital behavior. System 100 may further provide a high-level simulation of a design's architectural operation, or employ the use of special purpose hardware to emulate the logic of a proposed design.

Figure 2A:
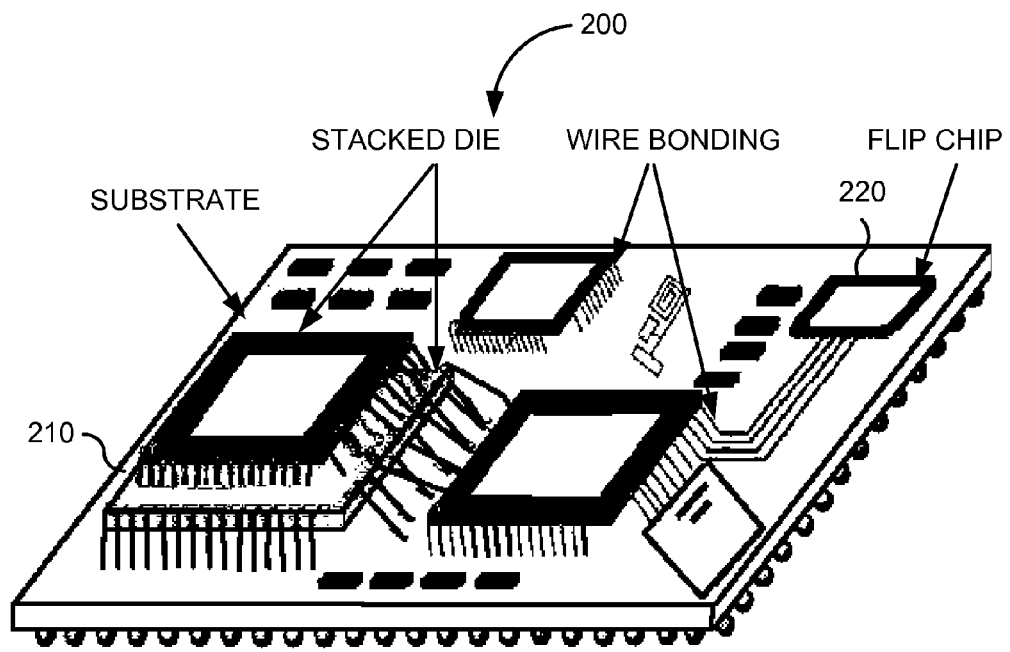
FIG. 2A is an illustration of an System-in-a-Package or System in Package (SiP) that may be used with embodiments of the present invention.

FIG. 2A is an illustration of System-in-a-Package or System in Package (SiP) 200 that may be used with embodiments of the present invention. SiP 200 can include substrate 210, in addition to one or more stacked dies, flip-chips (e.g., flip-chip 220), wires, or other elements. SiP 200 may use wire bonding or flip-chip techniques to connect one or more microchips to substrate 210.

For wire bonding dies associated with SiP 200, I/O pads of a microchip may be connected to bond pads around the chip cavity on substrate 210 through bonding wires. For flip-chip dies associated with SiP 200, on-chip re-distribution layer (RDL) routing may first connect I/O pads to bump pads. Escape routing may then break out bump pads to the boundary of the die in build-up or signal layers associated with substrate 210. Off-chip substrate routing on substrate 210 may connect escape break points of flip-chip dies or bond pads of wire bonding dies to balls of substrate 210.

Figure 2B:
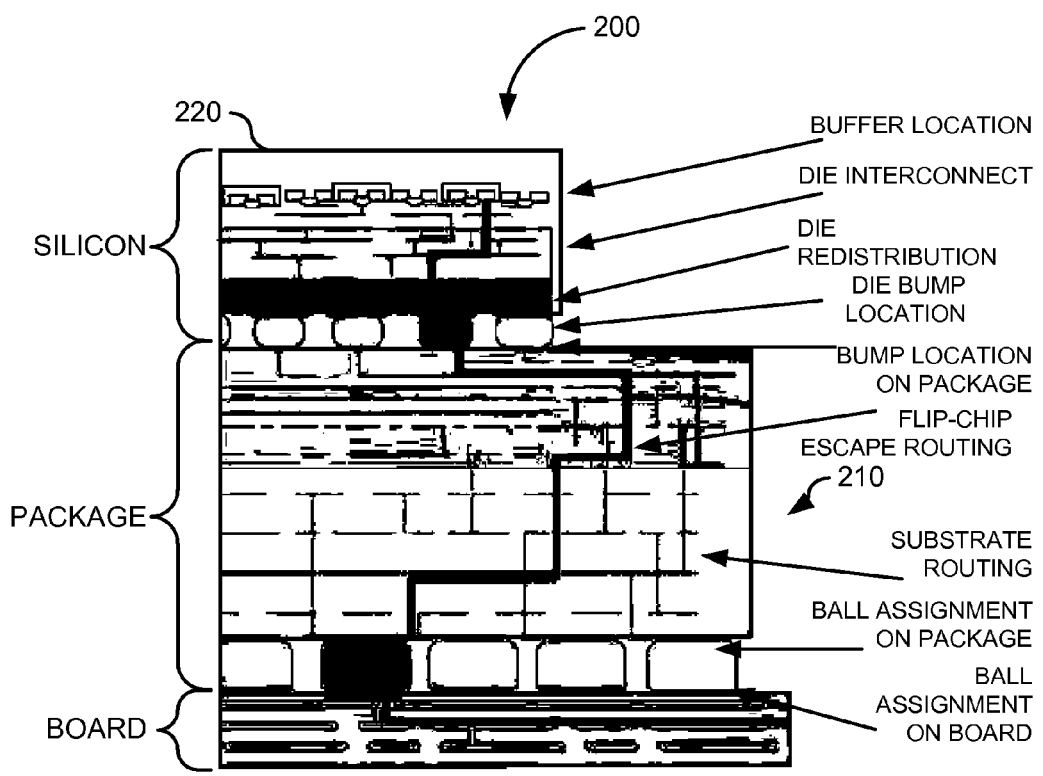
FIG. 2B is an illustration of a flip-chip BGA associated with the SiP of FIG. 2A.

FIG. 2B is an illustration of flip-chip 220 associated with SiP 200 of FIG. 2A. In this example, topological routes may be created between escape break points for flip-chip 220 and the location or end-point above the center of a corresponding ball. After topological routing, staggered vias may be used to connect an end-point to a ball of substrate 210.

As discussed above, SiP can require flexible locations of bond-pads and escape break points beyond a single rectangular ring provided by traditional topological routing tools. Thus, conventional 1.5 D routing may not be flexible enough for SiP and even some one-die packages. Moreover, once a net is routed, it can become an obstacle for other un-routed nets and may impact the results of routing, resulting in the net ordering problem. In various embodiments, a topological routing tool can be used consider the substrate topological routing simultaneously with via assignment, and support flexible via locations with more build-up and core layers.

Figure 3A:
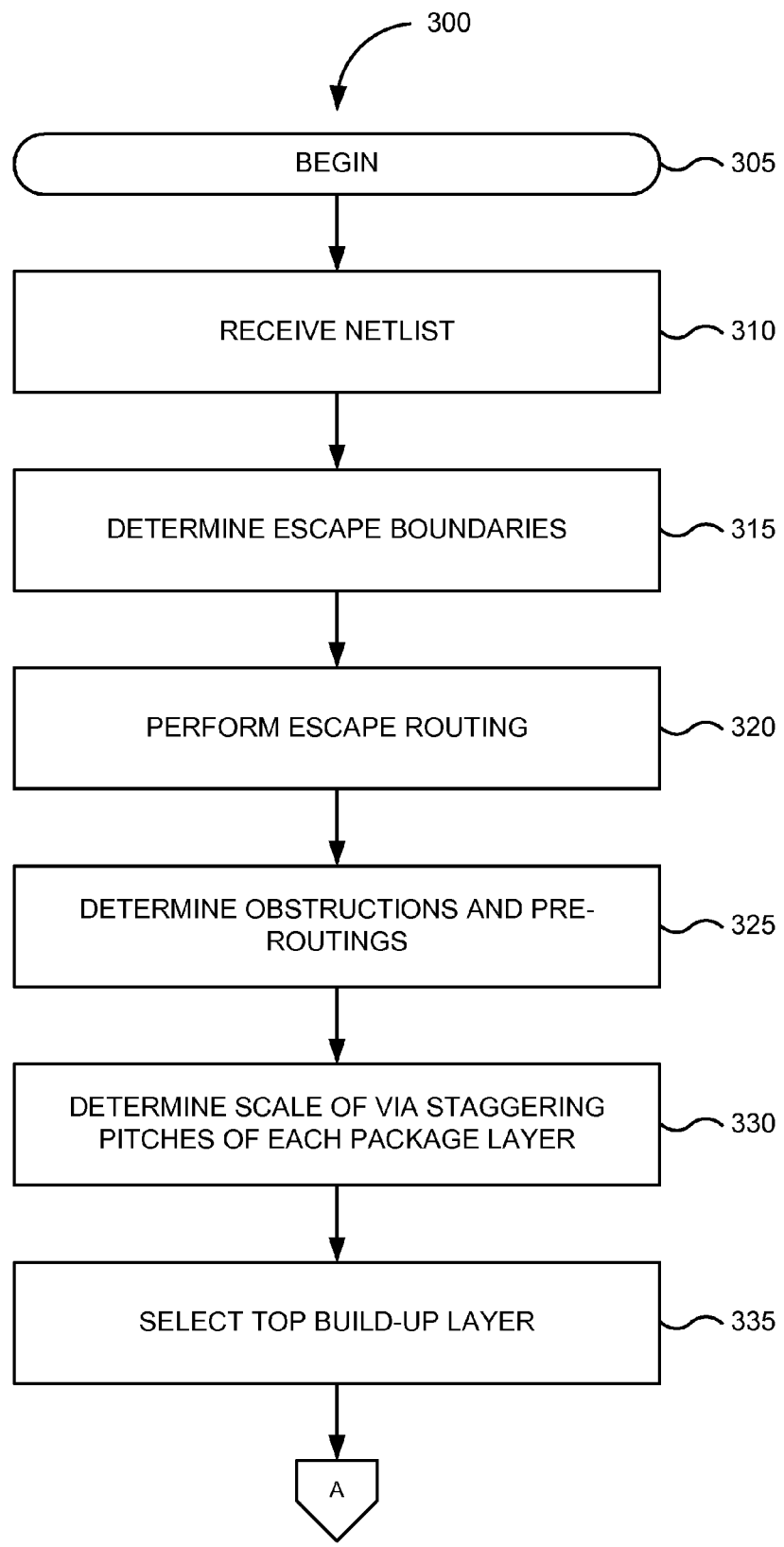
FIGS. 3A and 3B are a flowchart of a method for topological routing and via assignment in one embodiment according to the present invention.
Figure 3B:
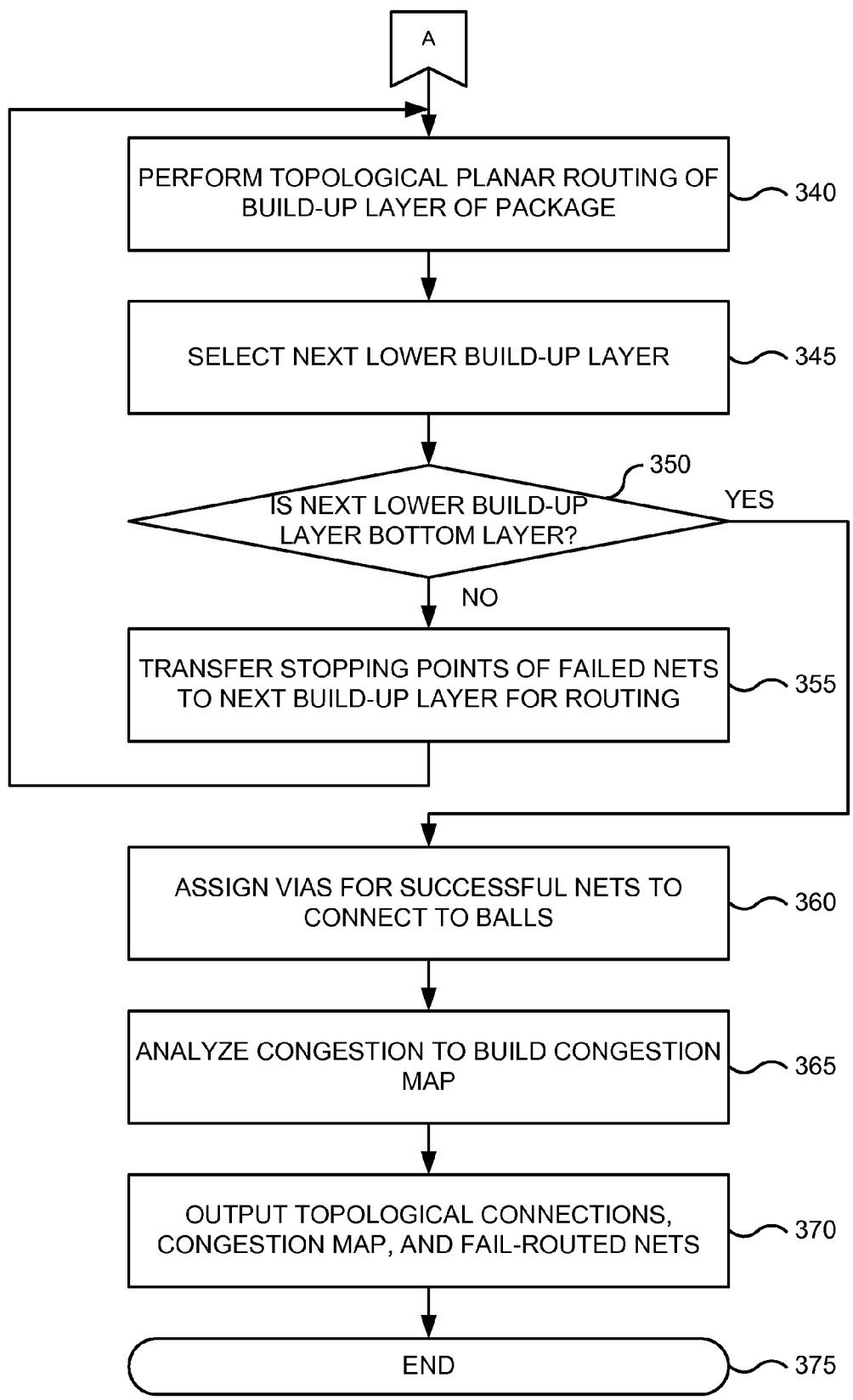

FIGS. 3A and 3B are a flowchart of a method for topological routing and via assignment in on embodiment according to the present invention. The processing depicted in FIGS. 3A and 3B may be performed by software modules (e.g., instructions or code) executed by a processor of a computer system, by hardware modules of an electronic device, or combinations thereof. FIG. 3A begins in step 305.

In step 310, a netlist is received. In various embodiments, the netlist can include the connectivity of an electronic design. The netlist may convey connectivity information, instances, nets, and attributes associated with a design. In some embodiments, hardware description languages, such as Verilog, VHDL, or any one of several specific languages designed for input to simulators may be used to specify a design.

Figure 4A:
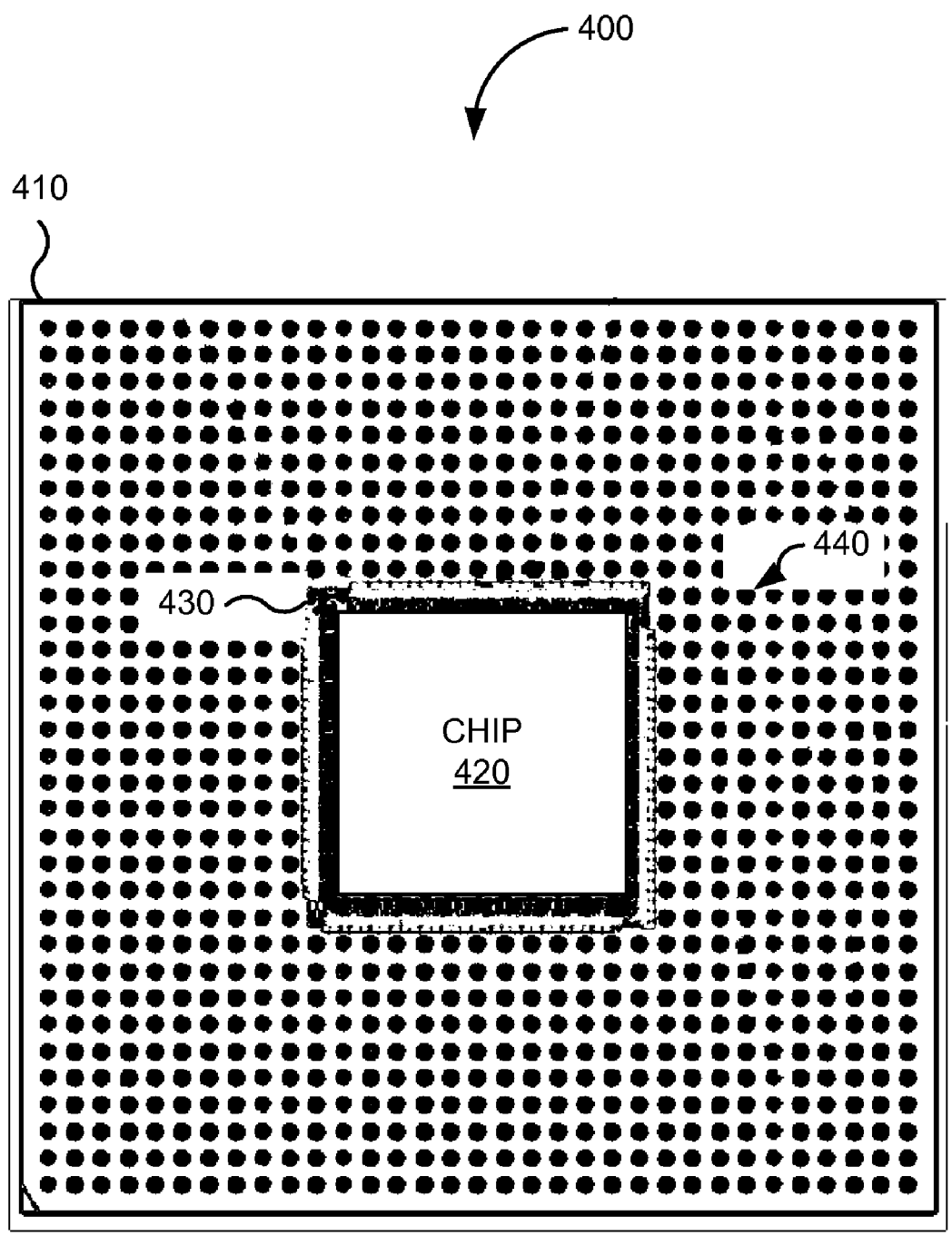
FIG. 4A is an illustration of a build-up layer in a BGA package with flip-chip design that may be used with various embodiments of the present invention.

In step 315, escape boundaries are determined. In step 320, escape routing is performed. FIG. 4A is an illustration of one example of a build-up layer in BGA package 400 with flip-chip design that may be used with various embodiments of the present invention. Typically, the most routing in BGA package 400 can occur on build-up layer 410, and is preferred to be planar routing. In this example, chip 420 can be placed substantially in the center of package 400 with bumps and escape routing. Signal bumps can be broken out on escape boundary 430 with initial escape routing. In some embodiments, the netlist defines interconnections of bumps and escape routing associated with chip 420 and balls 440 of package 400. Balls 440 can be distributed on the bottom layer of package 400, which may be the nearest layer to PCB.

Figure 4B:
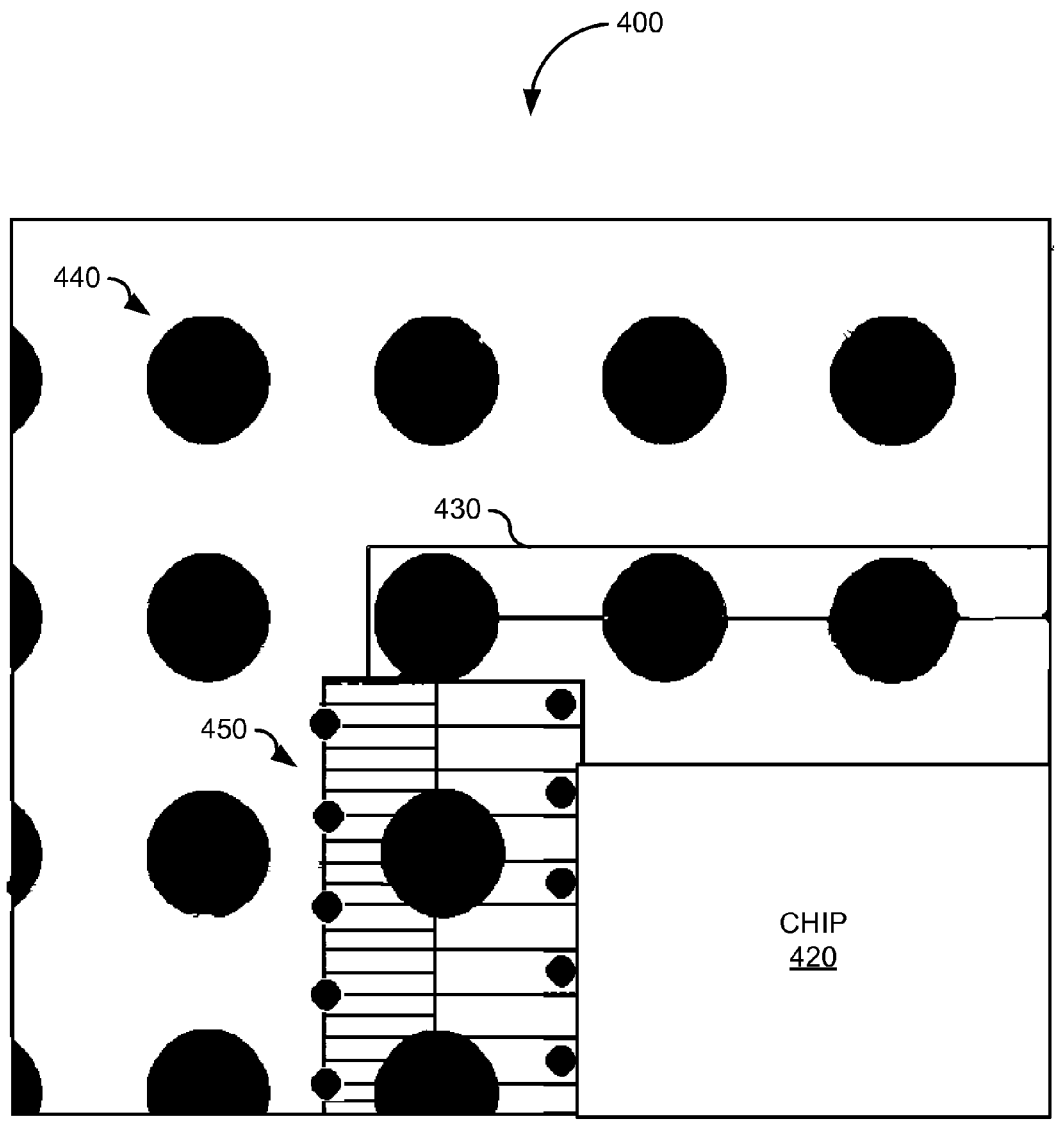
FIG. 4B is an illustration of a magnified view of the corner of an escape boundary associated with the flip-chip design of FIG. 4A.

FIG. 4B is an illustration of a magnified view of the corner of escape boundary 430 associated with the flip-chip design of FIG. 4A. In this example, a set of break points 450 are broken out on escape boundary 430 for connecting to balls

440. As for this routing work, in various embodiments, system 100 can generate topological routing solutions and density maps in order to give a routability analysis for BGA package 400.

Figure 5:
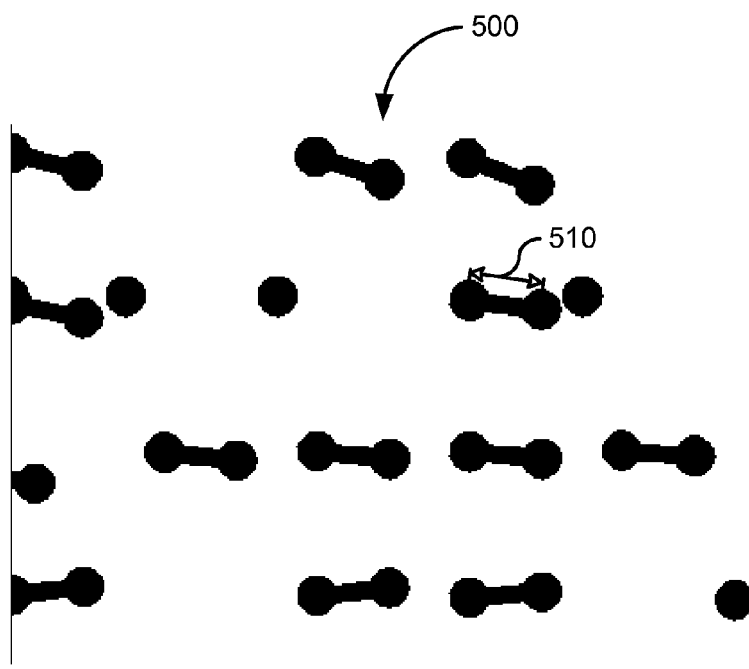
FIG. 5 is an illustration of via staggering pitches in one embodiment according to the present invention.

Returning to FIG. 3A, in step 325, obstructions of vias and pre-routings are determined. In step 330, the scale of via staggering pitches on each package layer (e.g., including build-up layers) are determined. In step 335, the top build-layer is selected. FIG. 5 is an illustration of via staggering pitches 510 on layer 500. Via staggering pitches 510 can be used to determine connections to balls of a BGA package (e.g., balls 440 of FIG. 4A).

Referring now to FIG. 3B, in step 340, topological routing of the selected build-up layer is performed. In SiP substrate routing, nets may include two pins, of which one pin is a break point or start-point and the other one is either a ball in the bottom layer or a pin on other dies, such as connections between dies. The case of connections between pins of different dies may be treated a special case of the connections between a start-point to the ball. In various embodiments, one or more nets may be connected topologically from a break point to the nearby position of an end point.

Figure 9A:
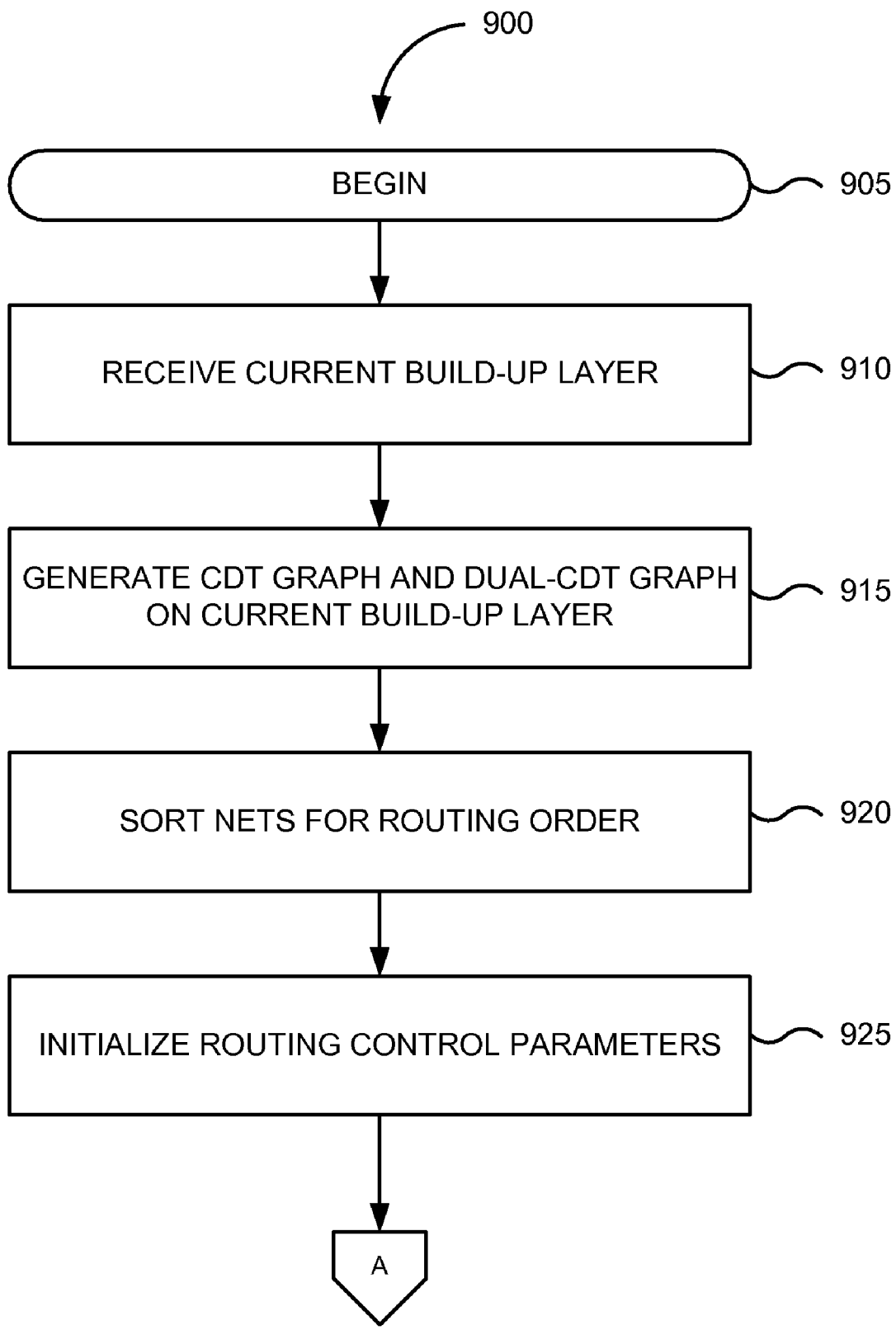
FIGS. 9A and 9B are a flowchart of a method for topological routing in one embodiment according to the present invention.
Figure 9B:
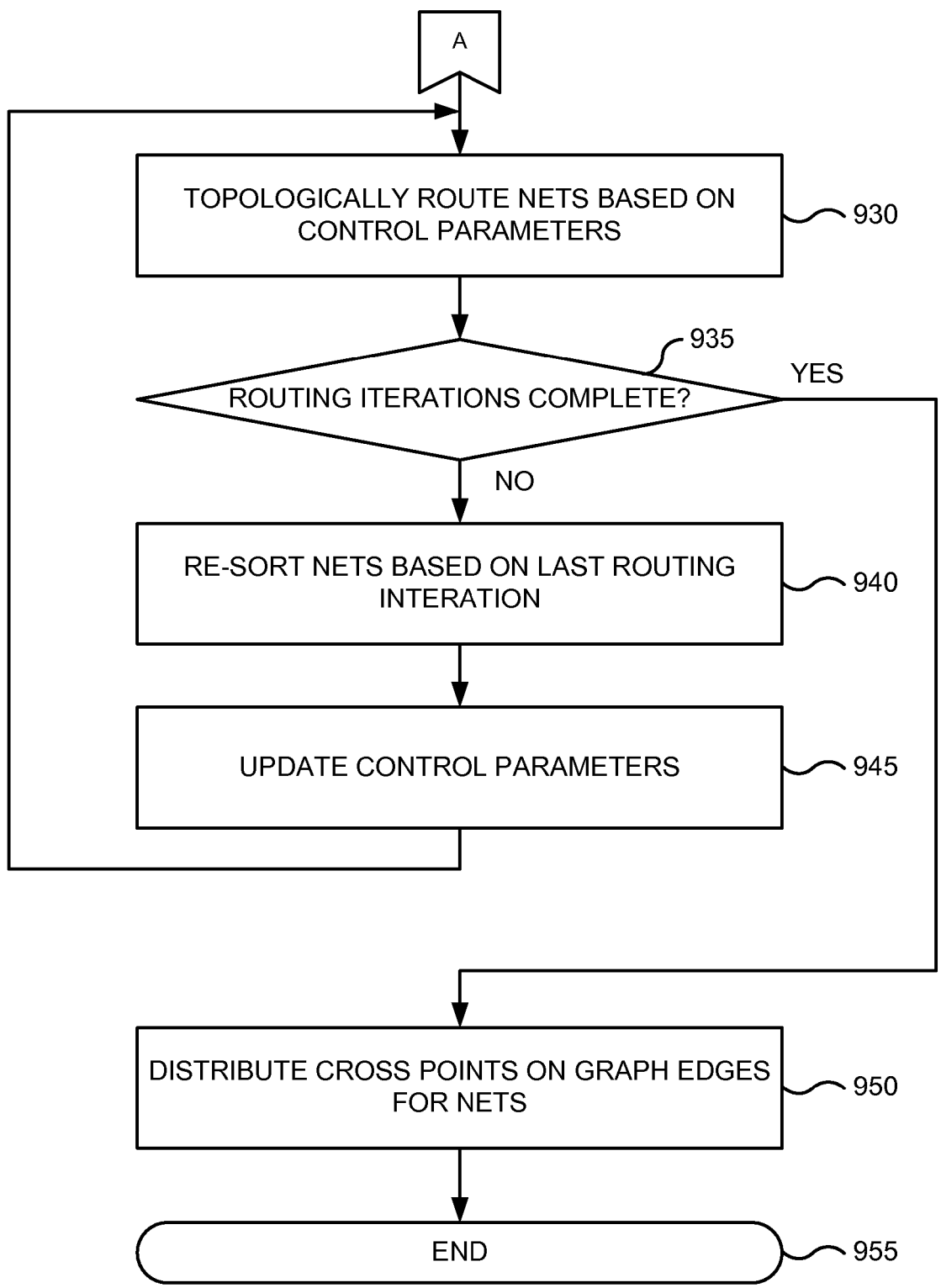

One example of a method for topological routing is discussed further with respect to FIGS. 9A and 9B. In various embodiments, topological planar routing may include a "dynamic pushing" operation, which can dynamically decide either to "push" or to "detour" routed nets blocking a net that is searching for its path. One example of a method for dynamic push for topological routing is discussed further with respect to FIG. 12. In some embodiments, the topological planar routing may not connect to exactly directly above a ball center, (i.e., an end point), but stop with some cost as penalty within the zone and use staging vias to complete the connections.

In step 345, the next lower build-up layer is selected. In step 350, a determination is made whether the selected next lower build-up layer is the bottom layer. If the selected layer is not the bottom layer of a package, in step 355, stopping points of failed nets are transferred to the selected next lower layer for routing. For example, if there are other layers on which net can be routed, stop points of failed nets may be transferred by vias to lower build-up layers, if possible. Accordingly, failed nets may have a chance to be routed on the next layer. The process then continues in step 340, where topological routing of the selected build-up layer is performed.

Figure 6:
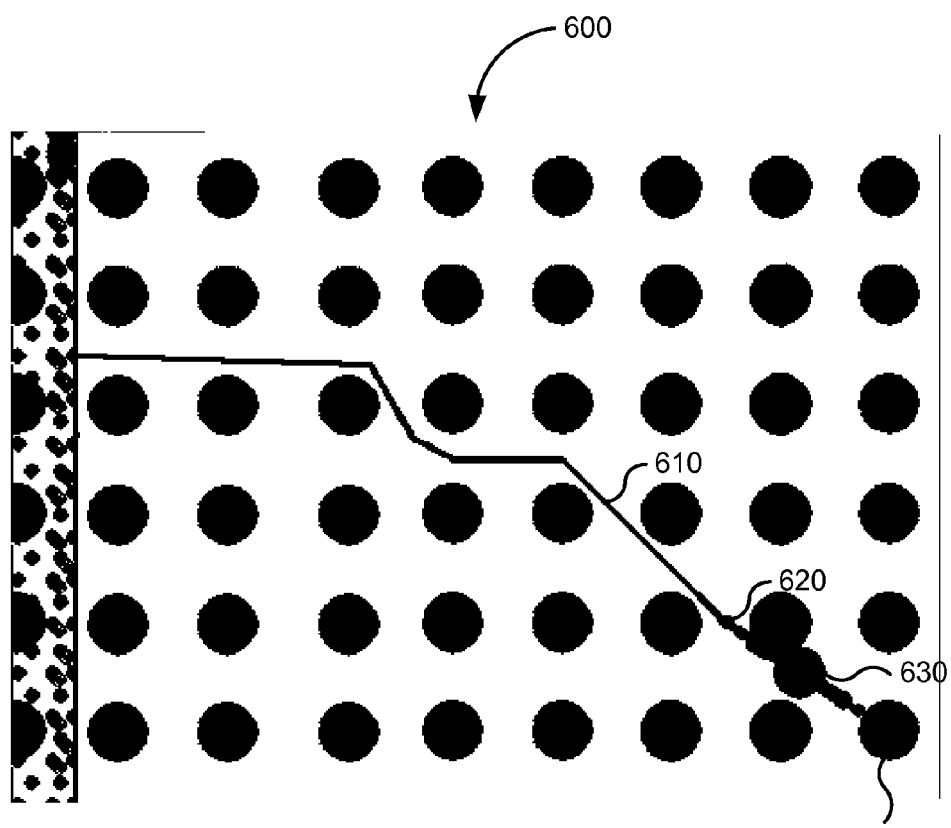
FIG. 6 is an illustration of via assignment in one embodiment according to the present invention.

If the selected layer is the bottom layer of a package, in step 360, vias are assigned to successful nets to connect to balls of the package. For example, on layer 600 of FIG. 6, via assignment 610 may be created for a successful net. Via assignment 610 may connect stop point 620 of the net using via 630 (e.g., with staggering pitches constraint) to ball 640 below.

Figure 7:
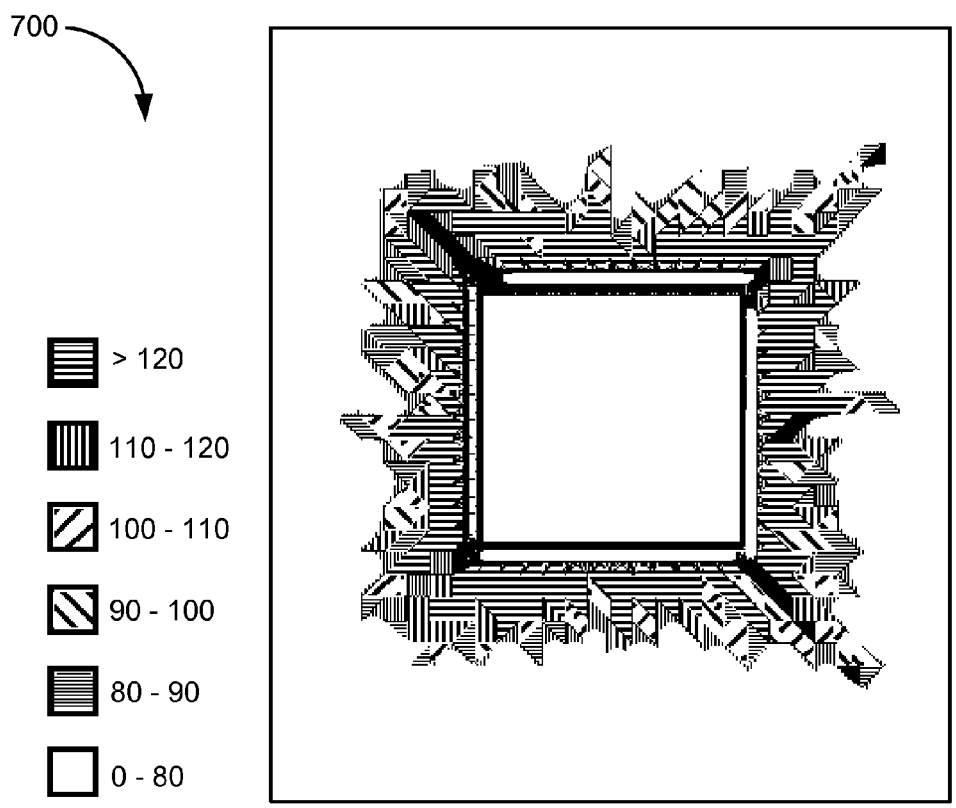
FIG. 7 is an illustration of an example density map that may be generated in various embodiments of the present invention.
Figure 8:
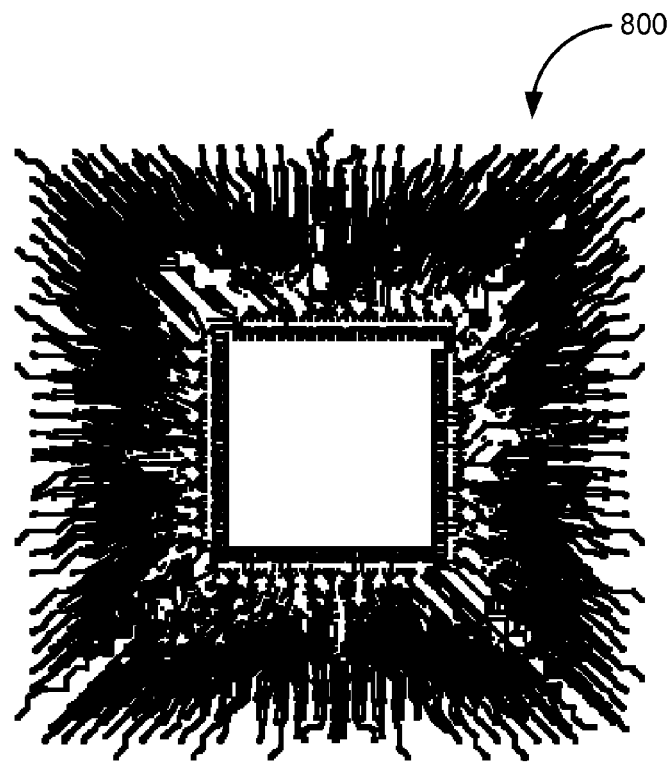
FIG. 8 is an illustration of a possible optimal topological planar routing solution that may be generated in various embodiments of the present invention.

Returning to FIG. 3B, in step 365, congestion is analyzed to generate a congestion map. In step 370, topological connections, congestions maps, and fail-routed nets are output. FIG. 3B ends in step 375. FIG. 7 is an illustration of density map 700 that may be generated in various embodiments of the present invention. FIG. 8 is an illustration of a possible optimal topological planar routing solution 800 that may be generated in various embodiments of the present invention.

FIGS. 9A and 9B are a flowchart of method 900 for topological routing in one embodiment according to the present invention. FIG. 9A begins in step 905.

Figure 10:
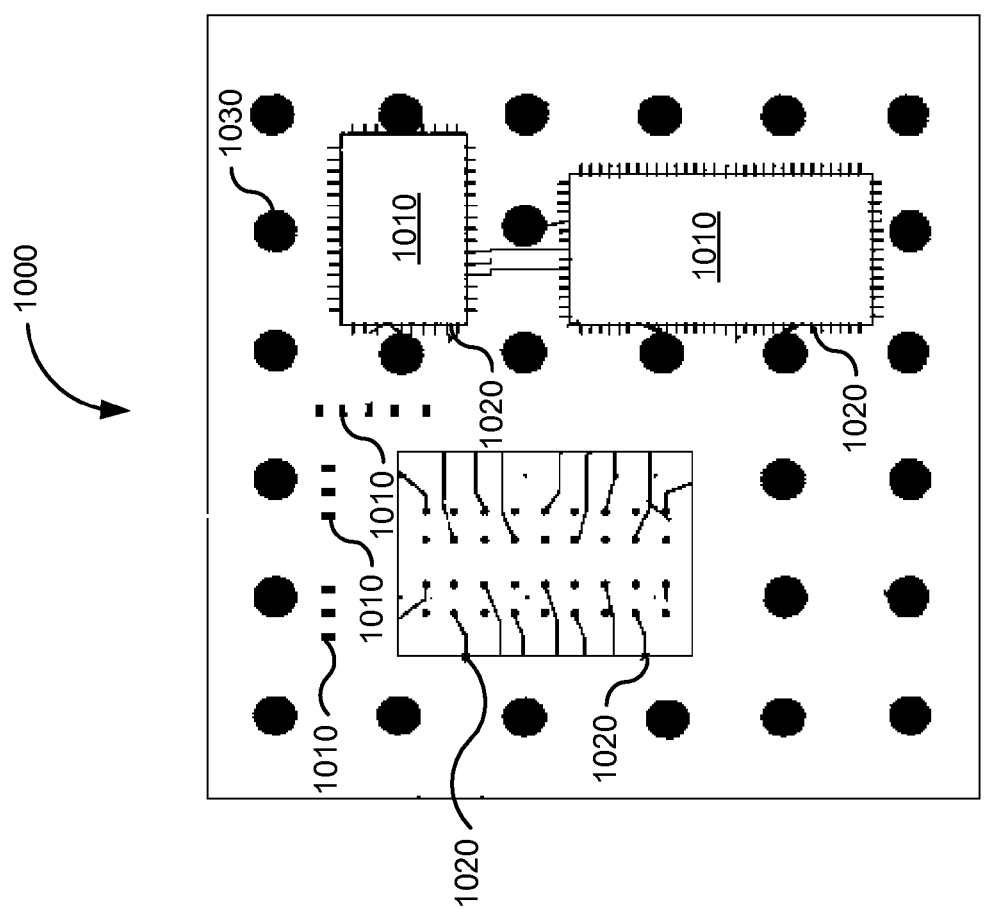
FIG. 10 is an illustration of a substrate routing graph that may be used with various embodiments of the present invention.

In step 910, a current build-up layer is received. In various embodiments, a substrate routing graph (SRG) may be generate to represent the current build-up layer. FIG. 10 is an illustration of substrate routing graph (SRG) 1000 that may be used with various embodiments of the present invention. In this example, SRG 1000 may map dies 1010, start-points 1020, and end-points 1030 (above the balls). SRG 1000 may map the dies 1010. start-points 1020, and end-points 1030 as obstacles.

Figure 11A:
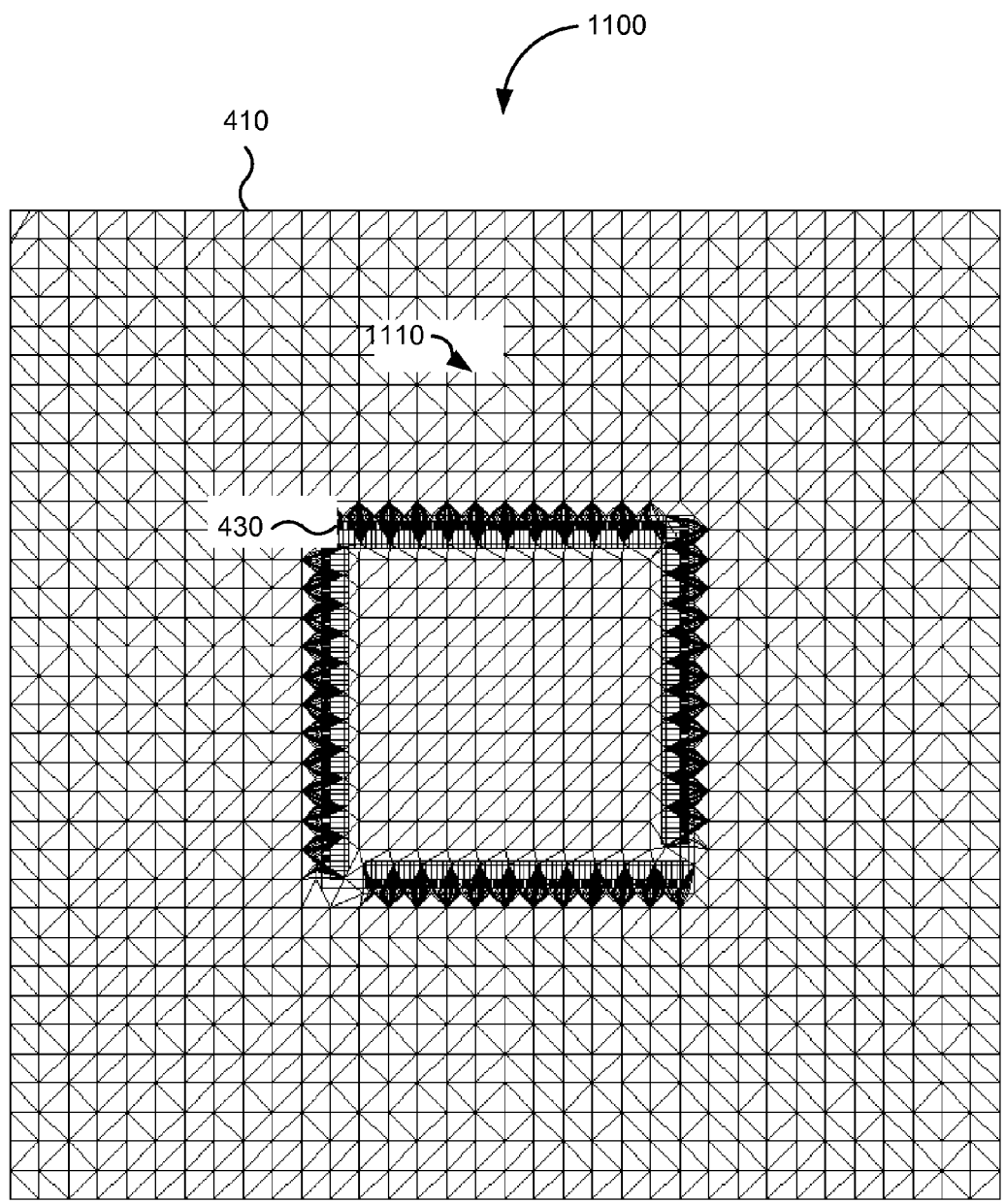
FIG. 11A is an illustration of a BGA package after triangulation which may be generated in various embodiments of the present invention.

In step 915 of FIG. 9A, a constraint Delaunay triangulation (CDT) graph and a dual-CDT graph is generated on current build-up layer. For example, SRG 800 of the current build-up layer may be further discretized by a set of elements, such as triangles, quadrilaterals, or other polygons (e.g., in two-dimensions). Considering constraints, such as high-density and aligned start-points, pre-routed connections, and other possible polygons on the plane associated with SRG 800, in various embodiments, a triangle mesh and constraint Delaunay triangulation (CDT) may be generated. FIG. 11A is an illustration of BGA package 1100 after triangulation which may be generated in various embodiments of the present invention. Triangle mesh 1110 may provide a low computational cost and reasonable well-shaped elements.

Figure 11B:
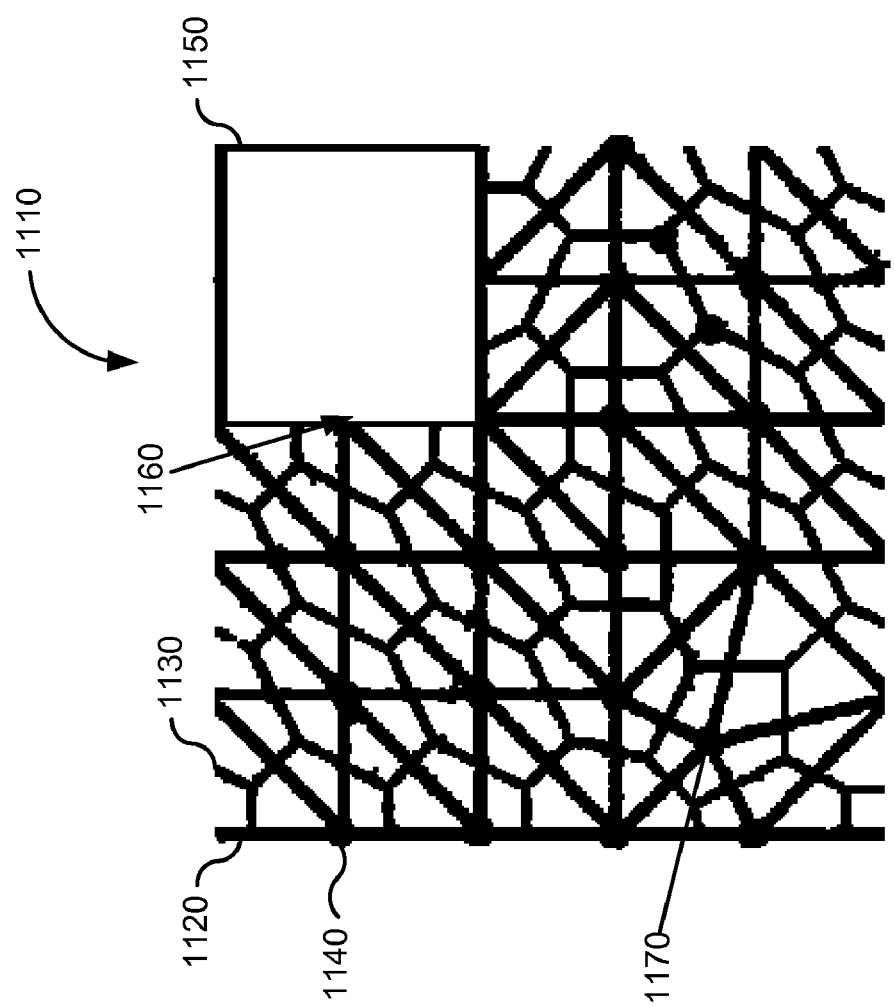
FIG. 11B is an illustration of a particle-insertion-based constraint Delaunay triangulation graph (PCDT) and its dual-PCDT (D-PCDT) graph that may be used with various embodiments of the present invention.

In some embodiments, uniformly spreading points may be added to SRG 800 for particle-insertion-based CDT (PCDT) construction. FIG. 11B is an illustration of particle-insertion-based constraint Delaunay triangulation (PCDT) graph 1120 and its dual-PCDT (D-PCDT) graph 1130 that may be used with various embodiments of the present invention. In this example, points (e.g., point 1140) have been added to SRG 800.

PCDT graph 1120 may be build by Quintuple(A, EP, O, U, b) on the routing plane associated with SRG 800. In Quintuple(A, EP, O, U, b), A can represent a set of start points (e.g., start-point 1160 associated with blockage 1150). EP can represent a set of end-points (e.g., end-point 1170). The end-points may be vertically above the center of a set of balls P. O can represent a set of obstacles (e.g., blockage 1150). The set of blockages may include escape area for escape routing, pre-routed connections, and other obstacles in the layer. U can represent a set of particles (e.g., particle 1140), and b can represent the boundary of SRG 800 plane. The start-points and end-points may become vertices of triangles associated with triangle mesh 1110. Dual-PCDT graph 1130 may be built accordingly as the dual of PCDT graph 1120.

In step 920 of FIG. 9A, nets are sorted for routing order. In step 925, routing control parameters are initialized. The routing control parameters can include information associated with one or more routing iterations, such as a maximal pushing nets count, congestion upper bound constraints in the current routing iteration, or the like.

In step 930 of FIG. 9B, the nets are topologically routed based on the control parameters. For example, a topological routing solution may be determine connecting each start-point in set A in Quintuple(A, EP, O, U, b) associated with PCDT graph 1120 to any point in a zone $N_{ep}$ for a specified end-point ep in set EP. The topological routing solution may be determine such that zone $N_{ep}$ can guarantee staggered vias to finish the rest of connections to the corresponding ball in set P. In various embodiments, total wire length can be reduced, and routed nets and obstacles may be planar and satisfy capacity constraints.

In various embodiments, the topological routing may include a dynamic search using a dynamic searching algorithm called DS* (DS-star). For example, a topological routing tool may route nets one by one accordingly using an improved dynamic searching algorithm with the routing control parameters. In some embodiments, post-process may be invoked whenever necessary along with topological planar routing to help to minimize problems, such as eliminating the "U" detours, and/or "V" detours.

For each two-pin net, the DS* algorithm may find a shortest path on D-PCDT graph 1130 (on PCDT graph 1120, it is a path from one triangle to another one) subject to one capacity constraint. The capacity $C_e$ of each edge ed of D-PCDT 1130 can be calculated as follows: Let e be the edge of PCDT 1120 and e crosses edge ed. If edge e is inside an obstacle, or on the boundary of the obstacle, or on the boundary of SRG 800 plane, then:

$C_e$=0, otherwise $C_e$=le, where le is the length of the edge e.

When a net is dynamically searching its path, a topological routing tool can dynamically either "push" or "detour" routed nets that block the way of the current net. One example of a dynamic push technique is discussed further with respect to FIG. 12.

In some embodiments, the topological planar routing may not connect to exactly directly above a ball center, (i.e., an end point). The topological routing may reach a zone nearby an end point. The topological routing with dynamic search may stop with some cost as penalty within the zone. One example of a floating endpoint technique is described further in U.S. patent application Ser. No. 12/146,215, filed Jun. 25, 2008 and entitled "Floating End Point Technique for Topological Routing of Semiconductor Packages," the entire disclosure of which is incorporated herein by reference.

Returning to FIG. 9B, in step 935, a determination is made whether routing iterations of the current build-up layer are complete. If routing iterations of the current build-up layer are not complete, in step 940, the nets are re-sorted based on the last routing iteration. In step 945, the control parameters are updated or otherwise modified. The process continues in step 930, where the nets are topologically routed based on the updated control parameters. If routing iterations of the current build-up layer are complete, in step 950, cross points are distributed for nets on edges of the CDT graph and/or edges of the dual-CDT graph. FIG. 9 ends in step 955.

Figure 12:
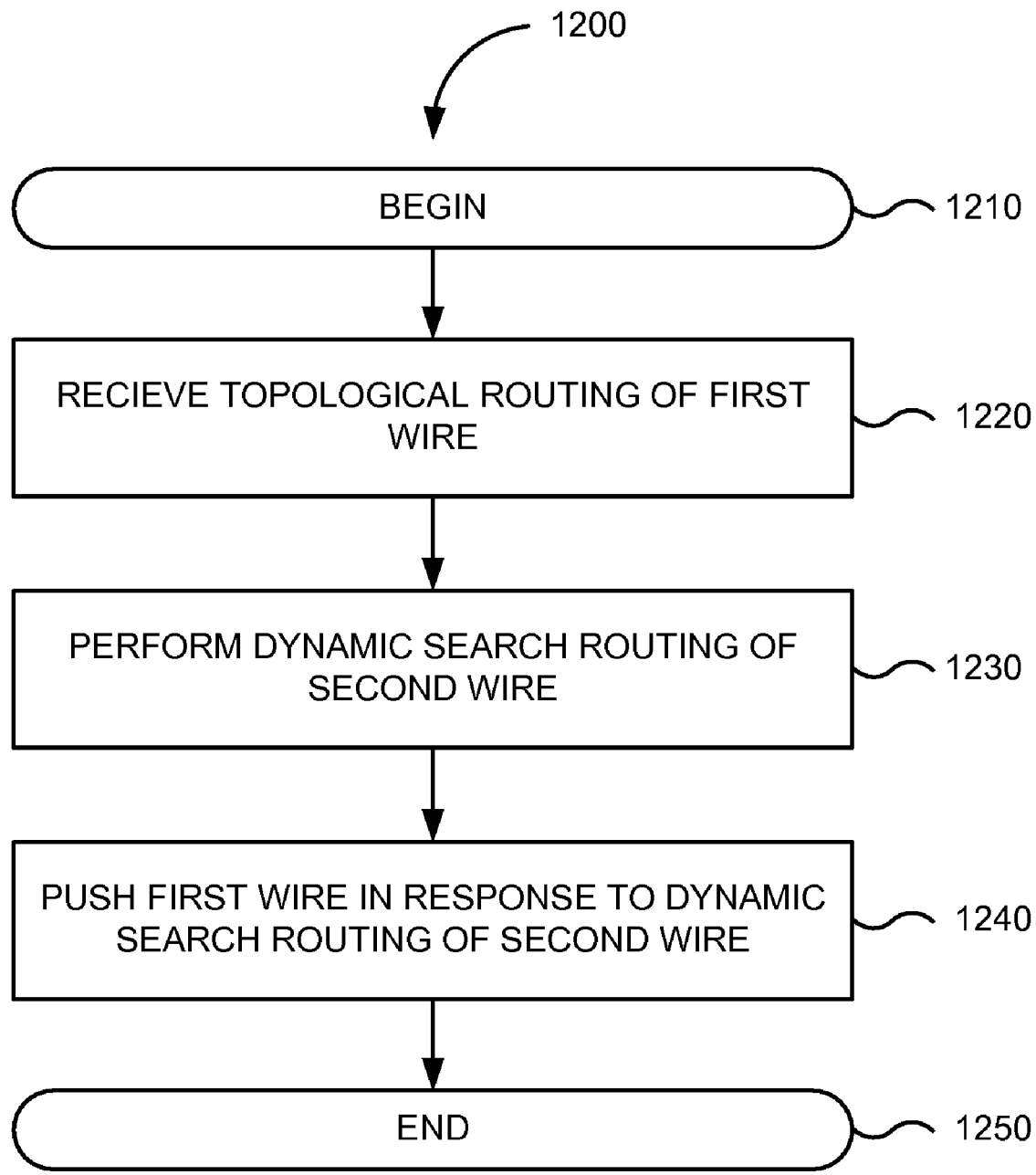
FIG. 12 is a flowchart of a method for dynamic push for topological routing of semiconductor packages in one embodiment according to the present invention.

FIG. 12 is a flowchart of method 1200 for dynamic push for topological routing of semiconductor packages in one embodiment according to the present invention. FIG. 12 begins in step 1210.

In step 1220, the topological routing of a first net or wire is determined. In step 1230, dynamic search routing is performed for a second net or wire. In step 1240, the first net or wire is pushed or detoured based on the dynamic search routing of the second net or wire. FIG. 12 ends in step 1250.

Figure 13A:
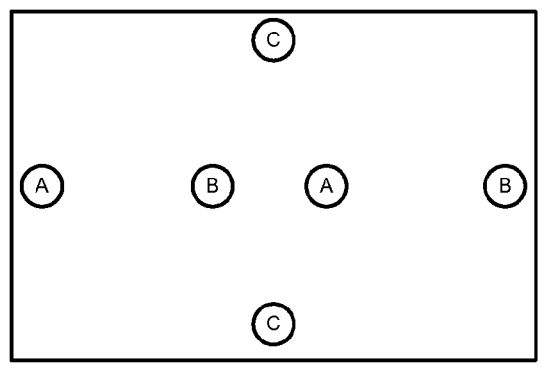
FIGS. 13A, 13B, and 13C are illustrations depicting topological routing for a first net ordering in one embodiment according to the present invention.
Figure 13B:
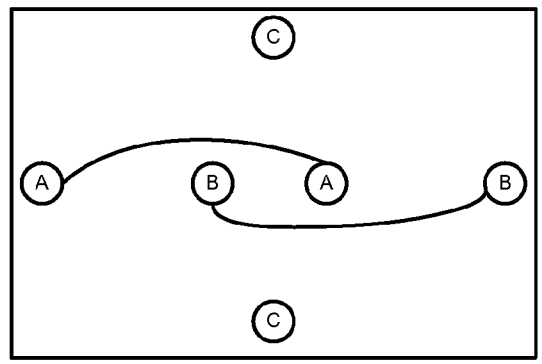
Figure 13C:
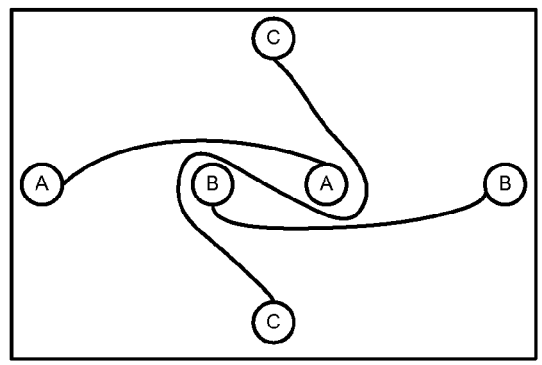

FIGS. 13A, 13B, and 13C are illustrations depicting topological routing for a first net ordering in one embodiment according to the present invention. In this example, net A and net B in FIG. 13A are symmetric. Accordingly, the possible net orders can include (A, B)-C (i.e., A-B-C and B-A-C), A-C-B, and C-(A, B). Most traditional routers can only resolve directly the order (A, B)-C show in FIGS. 13B and 13C, for example, using a Rubber-Band method.

In various embodiments, a topological routing tool with dynamic push can handle most net orders un-resolvable by prior methods. FIGS. 14A, 14B, 14C, and 14D are illustrations depicting topological routing using dynamic push or detour for a second net ordering in one embodiment according to the present invention. For the net order A-C-B, a topological routing tool with dynamic search (e.g., using the DS* algorithm) may connect net A and net C as shown in FIG. 14A. Referring to FIG. 14B, for net B the topological routing tool may choose either path 1 or path 2. Based on the chosen path, the topological routing tool can "push" routed net C. For example, if the topological routing tool chooses path 1, the tool pushes routed net C as shown in FIG. 14C. If the topological routing tool chooses path 2, the tool pushes routed net C as shown in FIG. 14D.

FIGS. 15A, 15B, 15C, and 15D are illustrations depicting topological routing using dynamic push or detour for a third net ordering in one embodiment according to the present invention. For the net order C-(A,B), a topological routing tool with dynamic search (e.g., using the DS* algorithm) may connect net C as shown in FIG. 15A. Referring to FIGS. 15B, 15C, and 15D, net A "pushes" routed net C, and then net B also "pushes" net C and uses either path 1 or path 2.

Figure 16A:
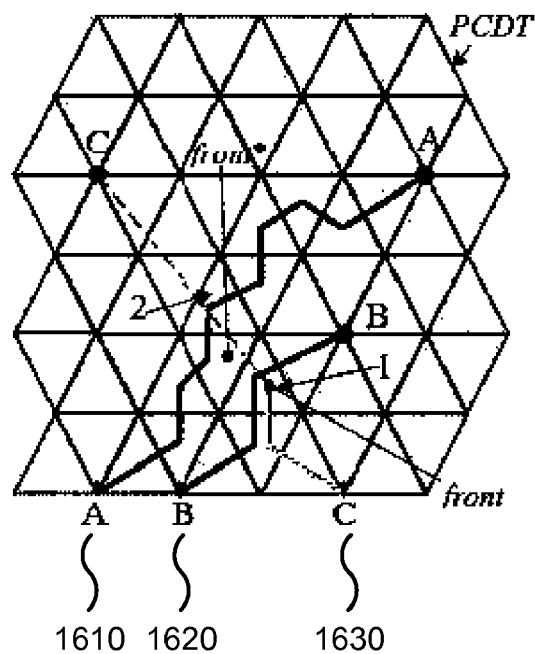
FIGS. 16A and 16B are illustrations depicting cost-driven pushing in one embodiment according to the present invention.
Figure 16B:
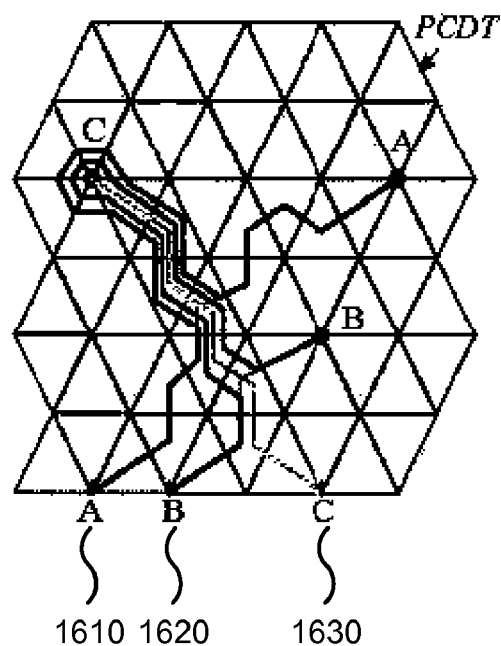

FIGS. 16A and 16B are illustrations depicting cost-driven pushing in one embodiment according to the present invention. In various embodiments, pushing may be embedding inside searching in a greedy fashion based on an evaluation function, the sum of actual cost, and an estimated cost. Data can be stored in a data structure called searching front. The data may include the width w of the front, the actual cost rc, and the estimated cost ec. The searching neighbor can be the set of possible triangles, with the movement originating from the searching front and stopping at one of the triangles (e.g., call the future front) that has the same structure as the searching front. To distinguish these two fronts, the future front may be denoted as front*, including w*, rc*, and ec*.

In this example, net A is routed between start-point 1610 and its end-point. Net B is routed between start-point 1620 and its end-point. When starting from start-point 1630 of net C, the following relationships exists:

$$w = w_0 + s_0 \quad (1)$$

$$rc = p_0 \times w \quad (2)$$

$$ec = h_0 \times w \quad (3)$$

In the above relationships, $w_0$ can represent the wire width and $s_0$ can represent the space of net C. In the above, $p_0$ can represent the distance from the start-point to front triangle barycenter. Additionally, $h_0$ can represent the distance from front triangle barycenter to the end-point.

If i represents the i-th net that blocks the movement from searching front to searching neighbor, then the wire width and space of net i can be represented by $w_i$ and $S_i$, respectively. In FIG. 16A, net B blocks net C when net C moves from front in triangle-1 to front*. Then, the front* can be calculated recursively by the following formulas:

$$w* = w + \sum_i (w_i + s_i) \quad (4)$$

$$rc* = rc + \Delta p \times w* \quad (5)$$

$$ec* = h \times w* \quad (6)$$

In the above equations, $\Delta p$ can represent the distance between the barycenters of the front triangle and the front* triangle, h can represent the distance between the front* triangle barycenters and the end-point.

Once a front* with a minimal evaluation function value is selected, the front* can recursively become the search front for the succeeding search. For example, when front enters triangle-2 of FIG. 16A, net A blocks net C from moving forward. Based on the cost of front* from formulas (4)-(6), net C may continue pushing nets A and B. Finally, a routing solution for net C may be achieved, for example, as shown in FIG. 16B.

Based on the above cost function, DS* can find an optimal path. For example, referring to FIG. 15C or FIG. 15D, as net B pushes net C, the searching front width w increases. When net B comes across net A along path 2, the total cost may dramatically increase. For example, net B may have to push both net C and net A. Thus, the topological routing tool may select an optimal solution (e.g., path 1) based on cost.

In various embodiments, control parameters may be provided to control the dynamic searching. In one example, a maximal pushing scalar may be provided. The maximal pushing scalar can represent the maximal number of nets that a net can push. When exceeding the limit or threshold, the searching front may not push anymore. Initially, the net order strongly affects the routing solution. Therefore, pushing can be very important for achieving better topology and an infinite cost value may be assigned to the maximal pushing scalar for one or more iterations. In succeeding iterations, better topology may gradually be achieved, and the wire length can more gradually impact the routing solution. During these iterations, fewer pushings may be allowed in order to encourage nets to stretch by re-routing. The maximal pushing scalar may gradually be reduced to zero in the succeeding iterations. For example, for connections between pins of different dies, the location of the end-point is may be fixed, therefore, the maximal pushing scalar may be set to zero in DS* to disable dynamic pushing.

In another example, congestion control parameter may be provided to direct DS* for congestion reduction. For example, the congestion control parameter may indicated that high congested graph edges are forbidden to be passed. In various embodiments, congestion control η may be estimated based on edges of triangles according to equation (7):

$$\eta = \frac{\sum_i (w_i + s_i)}{l_{edge}} \quad (7)$$

In the above equation, $l_{edge}$ can represent the length of the triangle edge. Additionally, $w_i$ and $s_i$ can represent the wire width and space of the net i passing through the edge, respectively. η may start with a relatively large number, and may gradually be decreased to 1 in the succeeding iterations.

Figure 17A:
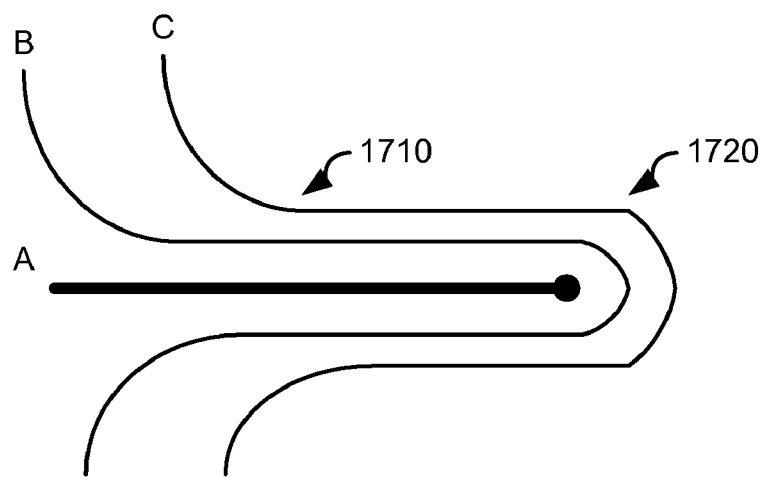
FIGS. 17A and 17B are illustrations of bent wires and stretched wires in one embodiment according to the present invention.
Figure 17B:
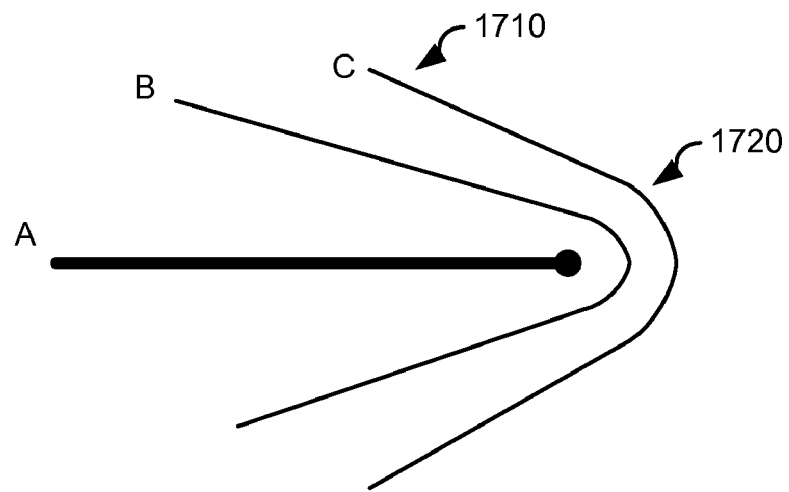

In some embodiments, re-ordering and re-routing can be used to reroute nets with bent wires caused by pushing. FIGS. 17A and 17B are illustrations of bent wires and stretched wires in one embodiment according to the present invention. Referring to FIG. 17A, bent wires at locations 1710 and 1720 of nets B and C may cause non-necessary wire length during pushing of net A. FIG. 17B shows that the bent wires of nets B and B can be stretched when re-routing net B and net C based on DS*.

As discussed above in FIGS. 9A and 9B, nets in a build-up layer can be sorted (e.g., re-sorted based on last routing iteration in step 940 of FIG. 9B). Control parameters can be updated or modified (e.g., step 945), and the net may be re-routed sequentially according to the re-sorted order and modified control parameters.

In various embodiments, during the first iteration of planar routing, short nets may have lower possibilities to block unrouted nets. Therefore, nets can be initially ordered such that the net with a relatively short distance u between the startpoint and end-point is routed early. In the later iterations, different strategies can be employed for re-ordering in each time of iteration, such as whole re-ordering and partial re-ordering.

Figure 18A:
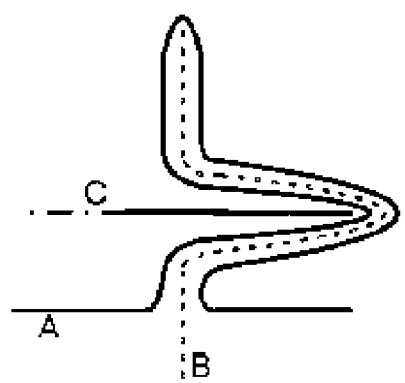
FIGS. 18A, 18B and 18C are illustrations of net re-ordering and re-routing in one embodiment according to the present invention.
Figure 18B:
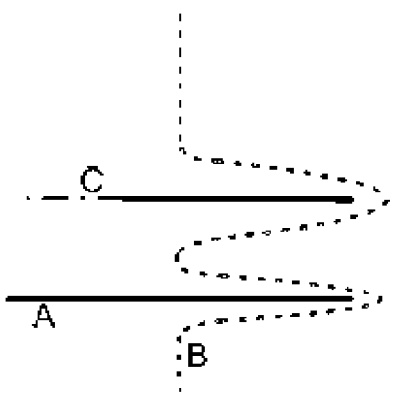

In whole re-ordering, after one routing iteration, some nets may be pushed more than once. The pushed nets may become much longer than their non-detour distance u. FIG. 18A is an illustrations of net re-ordering and re-routing in one embodiment according to the present invention. In FIG. 18A, net A may be pushed first by net B, and then by net C. In some embodiments, net A and net B may be given a high priority to reroute and stretch themselves. In FIG. 18B, after re-routing with the order of A-B-C, a better solution may be implemented than in FIG. 18A with shorter length achieved.

In some embodiments, a net length ratio δ may be defined such that δ=l/u, where l can represent the net length determined from the latest routing iteration. In the whole re-ordering, the ordering may be performed with the larger net length ratio first. In other words, the net with a larger length penalty caused by pushing can be given a higher priority for rerouting.

Figure 18C:
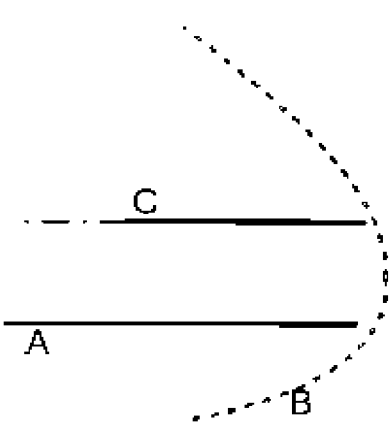

After performing whole re-ordering in each time of iteration, in further embodiments, a partial re-ordering may be performed for further adjustment. Partial re-ordering may be performed in case one net pushes a group of nets. If so, the last pushed net may be given the highest priority for re-routing, ignoring the whole reordering. For example, in FIG. 18A, the net length ratio δ of net B may be larger than that of net C. During whole reordering, net B may be re-routed first. However, because net C may be the last pushed net in a group, using partial reordering, net C may be re-routed first, and then net B as shown in FIG. 18C.

Figure 19:
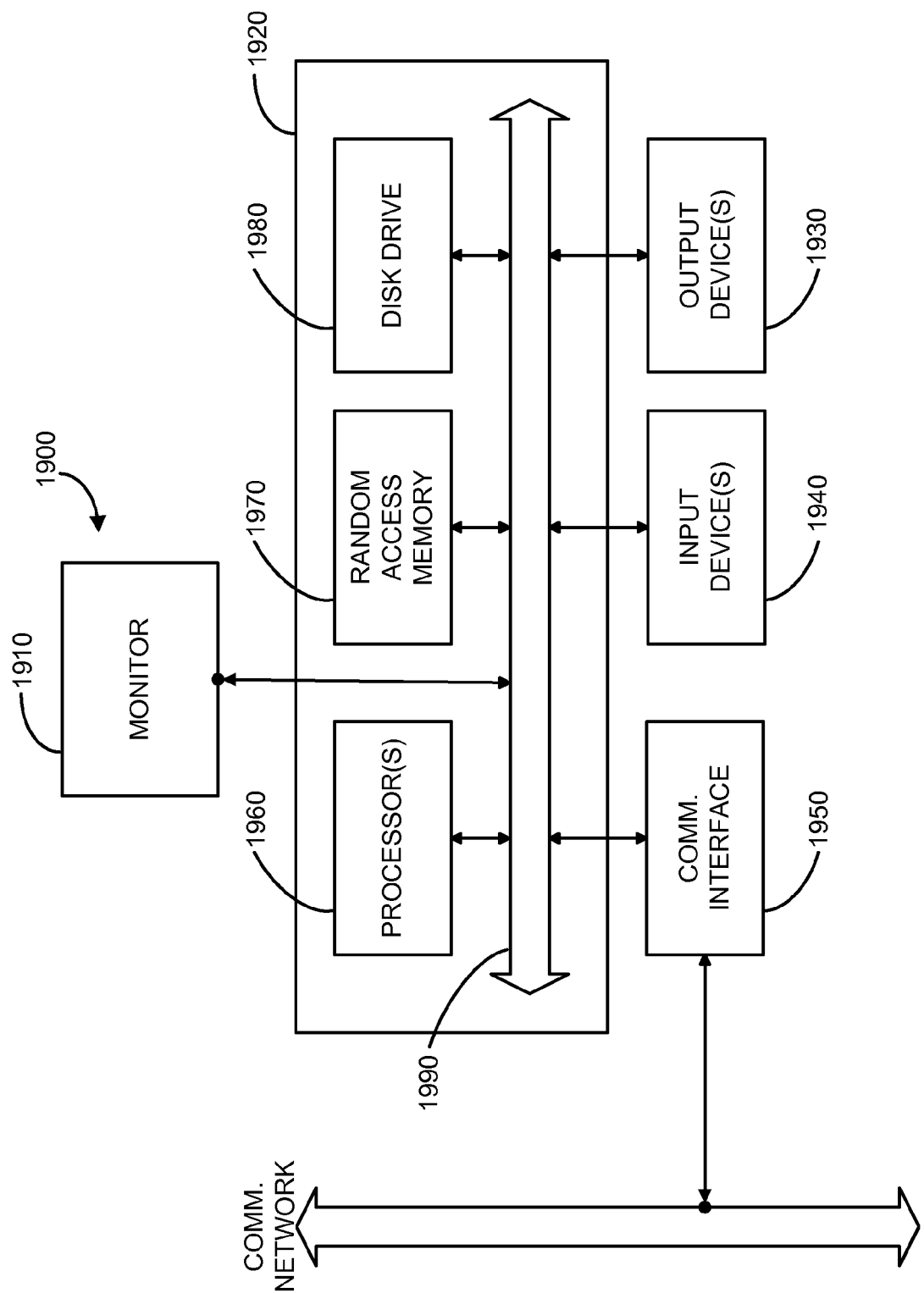
FIG. 19 is a simplified block diagram of a computer system that may incorporate embodiments of the present invention.

FIG. 19 is a simplified block diagram of a computer system 1900 that may incorporate embodiments of the present invention. FIG. 19 is merely illustrative of an embodiment incorporating the present invention and does not limit the scope of the invention as recited in the claims. One of ordinary skill in the art would recognize other variations, modifications, and alternatives.

In one embodiment, computer system 1900 typically includes a monitor 1910, a computer 1920, user output devices 1930, user input devices 1940, communications interface 1950, and the like.

As shown in FIG. 19, computer 1920 may include a processor(s) 1960 that communicates with a number of peripheral devices via a bus subsystem 1990. These peripheral devices may include user output devices 1930, user input devices 1940, communications interface 1950, and a storage subsystem, such as random access memory (RAM) 1970 and disk drive 1980.

User input devices 1930 include all possible types of devices and mechanisms for inputting information to computer system 1920. These may include a keyboard, a keypad, a touch screen incorporated into the display, audio input devices such as voice recognition systems, microphones, and other types of input devices. In various embodiments, user input devices 1930 are typically embodied as a computer mouse, a trackball, a track pad, a joystick, wireless remote, drawing tablet, voice command system, eye tracking system, and the like. User input devices 1930 typically allow a user to select objects, icons, text and the like that appear on the monitor 1910 via a command such as a click of a button or the like.

User output devices 1940 include all possible types of devices and mechanisms for outputting information from computer 1920. These may include a display (e.g., monitor 1910), non-visual displays such as audio output devices, etc.

Communications interface 1950 provides an interface to other communication networks and devices. Communications interface 1950 may serve as an interface for receiving data from and transmitting data to other systems. Embodiments of communications interface 1950 typically include an Ethernet card, a modem (telephone, satellite, cable, ISDN), (asynchronous) digital subscriber line (DSL) unit, FireWire interface, USB interface, and the like. For example, communications interface 1950 may be coupled to a computer network, to a FireWire bus, or the like. In other embodiments, communications interfaces 1950 may be physically integrated on the motherboard of computer 1920, and may be a software program, such as soft DSL, or the like.

In various embodiments, computer system 1900 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1920 includes one or more Xeon microprocessors from Intel as processor(s) 1960. Further, one embodiment, computer 1920 includes a UNIX-based operating system.

RAM 1970 and disk drive 1980 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1970 and disk drive 1980 may be configured to store the basic programming and data constructs that provide the functionality of the present invention.

Software code modules and instructions that provide the functionality of the present invention may be stored in RAM 1970 and disk drive 1980. These software modules may be executed by processor(s) 1960. RAM 1970 and disk drive 1980 may also provide a repository for storing data used in accordance with the present invention.

RAM 1970 and disk drive 1980 may include a number of memories including a main random access memory (RAM) for storage of instructions and data during program execution and a read only memory (ROM) in which fixed instructions are stored. RAM 1970 and disk drive 1980 may include a file storage subsystem providing persistent (non-volatile) storage for program and data files. RAM 1970 and disk drive 1980 may also include removable storage systems, such as removable flash memory.

Bus subsystem 1990 provides a mechanism for letting the various components and subsystems of computer 1920 communicate with each other as intended. Although bus subsystem 1990 is shown schematically as a single bus, alternative embodiments of the bus subsystem may utilize multiple busses.

FIG. 19 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

What is claimed is:

1. A computer-implemented method for routing topological interconnections for a package, the method comprising:
   receiving, using one or more processors associated with one or more computer systems, information associated with a chip;
   determining an escape routing of a bump array for the chip, the escape routing indicative of a set of I/Os along a set of escape boundaries;
   determining a set of obstructions on a set of package layers;
   determining a scale of via staggering pitches on the set of package layers;
   for each build-up layer in the set of package layers, from a top layer to a bottom layer:
      performing a topologically planar routing of each I/O in the set of I/Os to a location substantially vertical to a center of a corresponding ball, wherein at least a first net is dynamically pushed in response to the topologically planar routing of a second net, and
      transferring a stopping point associated with an I/O for a failed net to another build-up layer by stack vias;
   assigning vias for one or more successfully routed nets;
   analyzing a congestion associated with each build-up layer to generate a congestion map; and
   generating, with the one or more processors associated with the one or more computer systems, information indicative of a set of topological interconnections, the congestion map, and a set of fail-routed nets and storing the information in a storage device associated with the one or more computers systems.

2. The method of claim 1, wherein said performing a topologically planar routing of each I/O in the set of I/Os comprises:
   distributing a set of particles over the build-up layer to generate a constraint Delaunay triangulation (CDT) graph;
   generating a dual of the CDT graph; and performing a dynamic search routing for each I/O based on the dual of the CDT graph.

3. The method of claim 2 wherein said performing a dynamic search routing for each I/O comprises:
sorting a set of nets on the build-up layer;
sequentially routing each net in response to one or more control parameters;
performing one or more re-route iterations to determine an improvement in a routing wire length; and
distributing cross points on a graph edge for each routed net.

4. The method of claim 3 wherein said sequentially routing each net comprises:
searching the shortest path from a source point to a sink point for a net using a dynamic search technique based on a triangulation plane.

5. The method of claim 4 wherein said sequentially routing each net using a dynamic search technique comprises:
pushing one or more nets blocking a search path associated with the net, the pushed nets being carried to a current searching node;
determining a realized cost and an estimated cost;
determining whether the current searching node is within a threshold to the sink point for the net, wherein the estimated cost is compared to a predefined stopping cost and the number of the pushed nets is compared to a maximal allowed pushing net count; and
if the current searching node is within a threshold to the sink point for the net:
post-processing the pushed nets to eliminate a "U" detour happening on a triangle edge or a "V" detour happening in a triangle.

6. The method of claim 5, wherein said determining the realized cost comprises:
determining a length of the shortest path from the source point to a dual node of a current searching triangle; and
determining wire widths of the net and the pushed nets.

7. The method of claim 5, wherein said determining the estimated cost comprises:
determining wire widths of the net and the pushed nets; and
determining a geometry distance from a dual node of a current searching triangle to the sink point.

8. The method of claim 3, wherein said performing one or more re-route iterations to determine an improvement in a routing wire length comprises:
re-ordering each net in response to the last routing iteration;
modifying the one or more control parameters in response to the last routing iteration; and
re-routing each net based on the re-ordering and the modified control parameters.

9. The method of claim 8, wherein said re-ordering each net comprises:
determining an estimate for a realized wire length for each net;
sorting each net in a decreasing order of an estimated realized wire length; and
modifying an ordering of one or more nets in response to a pushing order of the pushed nets.

10. The method of claim 8, wherein said re-routing each net based on the re-ordering and the modified control parameters comprises:
deleting a net path on a current build-up layer; and
routing the net based on the modified control parameters.

11. The method of claim 1, wherein said assigning vias for one or more successfully routed nets comprises:
determining via positions along a straight line from a stopping point to a corresponding ball center based on the scale of via staggering pitches.

12. The method of claim 1, wherein said analyzing a congestion associated with each build-up layer to generate a congestion map comprises:
analyzing edge congestion on a set of triangle edges; and
analyzing area congestion in a set of triangles.

13. A computer-implemented method for routing topological interconnections for a package, the method comprising:
receiving, using one or more processors associated with one or more computer systems, information associated with a build-up layer of the package;
generating a constraint Delaunay graph and a corresponding dual constraint Delaunay graph for the build-up layer;
determining a routing order associated with a set of nets for the build-up layer to generate a first set of ordered nets;
determining a set of routing control parameters;
performing a dynamic search routing using the dual constraint Delaunay graph and the set of routing control parameters to determine a topological planar routing for each net in the first set of ordered nets, wherein at least one net in the first set of ordered nets detours another net in the first set of ordered nets; and
generating, with the one or more processors associated with the one or more computer system, information indicative of the topological planar routing for each net in the first set of ordered nets and storing the information in a storage device associated with the one or more computers systems.

14. The method of claim 13 further comprising:
re-sorting the nets in the first set of ordered nets to generate a second set of ordered nets;
modifying the set of routing control parameters in response to the nets; and
performing a dynamic search routing using the dual constraint Delaunay graph and the modified set of routing control parameters to determine a topological planar routing for each net in the second set of ordered nets, wherein at least one net in the second set of ordered nets detours another net in the second set of ordered nets.

15. The method of claim 13 further comprising:
determining a cost associated with a topological planar routing for each net in the first set of ordered nets; and
pushing the at least one net in the first set of ordered nets when the cost fails to exceed a pre-determined threshold.

16. The method of claim 13 further comprising:
determining a congestion associated with a topological planar routing for each net in the first set of ordered nets; and
pushing the at least one net in the first set of ordered nets when the congestion satisfies a pre-determined tolerance.

17. The method of claim 13 further comprising:
modifying the at least one net subsequent to being pushed to reduce a length of the at least one net.

18. A non-transitory computer readable medium configured to store a set of code modules which when executed by a processor of a computer system become operational with the processor for routing topological interconnections of a package, the non-transitory computer readable medium comprising:
code for receiving information associated with a chip;
code for determining an escape routing of a bump array for the chip, the escape routing indicative of a set of I/Os along a set of escape boundaries;

code for determining a set of obstructions on a set of package layers;

code for determining a scale of via staggering pitches on the set of package layers;

code for, for each build-up layer in the set of package layers, from a top layer to a bottom layer:

performing a topologically planar routing of each I/O in the set of I/Os to a location substantially vertical to a center of a corresponding ball, wherein at least a first net is dynamically pushed in response to the topologically planar routing of a second net, and transferring a stopping point associated with an I/O for a failed net to another build-up layer by stack vias;

code for assigning vias for one or more successfully routed nets;

code for analyzing a congestion associated with each build-up layer to generate a congestion map; and code for generating information indicative of a set of topological interconnections, the congestion map, and a set of fail-routed nets.

19. The non-transitory computer readable medium of claim 18, wherein said code for performing a topologically planar routing of each I/O in the set of I/Os comprises:

code for distributing a set of particles over the build-up layer to generate a constraint Delaunay triangulation (CDT) graph;

code for generating a dual of the CDT graph; and code for performing a dynamic search routing for each I/O based on the dual of the CDT graph.

20. The non-transitory computer readable medium of claim 19, wherein said code for performing a dynamic search routing for each I/O comprises:

code for sorting a set of nets on a build-up layer;

code for sequentially routing each net in response to one or more control parameters;

code for performing one or more re-route iterations to determine an improvement in a routing wire length; and code for distributing cross points on a graph edge for each routed net.

21. The non-transitory computer readable medium of claim 20, wherein said code for sequentially routing each net comprises:

code for searching the shortest path from a source point to a sink point for a net using a dynamic search technique based on a triangulation plane.

22. The non-transitory computer readable medium of claim 20, wherein said code for performing one or more re-route iterations to determine an improvement in a routing wire length comprises:

code for re-ordering each net in response to the last routing iteration;

code for modifying the one or more control parameters in response to the last routing iteration; and code for re-routing each net based on the re-ordering and the modified control parameters.

23. The non-transitory computer readable medium of claim 22, wherein said code for re-ordering each net comprises:

code for determining an estimate for a realized wire length for each net;

code for sorting each net in a decreasing order of an estimated realized wire length; and code for modifying an ordering of one or more nets in response to a pushing order of pushed nets.

24. A non-transitory computer readable medium configured to store a set of code modules which when executed by a processor of a computer system become operational with the processor for routing topological interconnections of a package, the non-transitory computer readable medium comprising:

code for receiving information associated with a build-up layer of the package;

code for generating a constraint Delaunay graph and a corresponding dual constraint Delaunay graph for the build-up layer;

code for determining a routing order associated with a set of nets for the build-up layer to generate a first set of ordered nets;

code for determining a set of routing control parameters; and code for performing a dynamic search routing using the dual constraint Delaunay graph and the set of routing control parameters to determine topological planar routing for each net in the first set of ordered nets, wherein at least one net in the first set of ordered nets detours another net in the first set of ordered nets.

25. A system for routing topological interconnections of a package, the system comprising:

a processor; and a memory coupled to the processor, the memory configured to store a set of instructions which when executed by the processor cause the processor to:

receive information associated with a chip;

determine an escape routing of a bump array for the chip, the escape routing indicative of a set of I/Os along a set of escape boundaries;

determine a set of obstructions on a set of package layers;

determine a scale of via staggering pitches on the set of package layers;

for each build-up layer in the set of package layers, from a top layer to a bottom layer:

perform a topologically planar routing of each I/O in the set of I/Os to a location substantially vertical to a center of a corresponding ball, wherein at least a first net is dynamically pushed in response to the topologically planar routing of a second net, and transfer a stopping point associated with an I/O for a failed net to another build-up layer by stack vias;

assign vias for one or more successfully routed nets;

analyze a congestion associated with each build-up layer to generate a congestion map; and generate information indicative of a set of topological interconnections, the congestion map, and a set of fail-routed nets.

26. The system of claim 25, wherein to perform a topologically planar routing of each I/O in the set of I/Os the processor is further caused to:

distribute a set of particles over a build-up layer to generate a constraint Delaunay triangulation (CDT) graph;

generate a dual of the CDT graph; and perform a dynamic search routing for each I/O based on the dual of the CDT graph.

27. The system of claim 26, wherein to perform a dynamic search routing for each I/O the processor is further caused to:

sort a set of nets on the build-up layer;

sequentially route each net in response to one or more control parameters;

perform one or more re-route iterations to determine an improvement in a routing wire length; and distribute cross points on a graph edge for each routed net.

28. The system of claim 27, wherein to sequentially route each net the processor is further caused to:
search the shortest path from a source point to a sink point for a net using a dynamic search technique based on a triangulation plane.

29. The system of claim 27, wherein to perform one or more re-route iterations to determine an improvement in a routing wire length the processor is further caused to:
re-order each net in response to the last routing iteration;
modify the one or more routing control parameters in response to the last routing iteration; and
re-route each net based on the re-ordering and the modified control parameters.

30. The system of claim 29, wherein to re-order each net the processor is further caused to:
determine an estimate for a realized wire length for each net;
sort each net in a decreasing order of an estimated realized wire length; and
modify an ordering of one or more nets in response to a pushing order of pushed nets.

31. The system of claim 29, wherein to re-route each net based on the re-ordering and the modified control parameters the processor is further caused to:
delete a net path on a current build-up layer; and
route the net based on the modified control parameters.

32. A system for routing topological interconnections of a package, the system comprising:
a processor; and
a memory coupled to the processor, the memory configured to store a set of instructions which when executed by the processor cause the processor to:
receive information associated with a build-up layer of the package;
generate a constraint Delaunay graph and a corresponding dual constraint Delaunay graph for the build-up layer;
determine a routing order associated with a set of nets for the build-up layer to generate a first set of ordered nets;
determine a set of routing control parameters; and
perform a dynamic search routing using the dual constraint Delaunay graph and the set of routing control parameters to determine a topological planar routing for each net in the first set of ordered nets, wherein at least one net in the first set of ordered nets detours another net in the first set of ordered nets.

* * * * *